United States Patent
Stefanopoulou et al.

(10) Patent No.: US 11,623,526 B2
(45) Date of Patent: Apr. 11, 2023

(54) STATE OF BATTERY HEALTH ESTIMATION BASED ON SWELLING CHARACTERISTICS

(71) Applicant: THE REGENTS OF THE UNIVERSITY OF MICHIGAN, Ann Arbor, MI (US)

(72) Inventors: Anna G. Stefanopoulou, Ann Arbor, MI (US); Nassim Abdul Samad, Ann Arbor, MI (US); Youngki Kim, Ann Arbor, MI (US); Jason B. Siegel, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 328 days.

(21) Appl. No.: 15/777,384

(22) PCT Filed: Nov. 18, 2016

(86) PCT No.: PCT/US2016/062782
§ 371 (c)(1),
(2) Date: May 18, 2018

(87) PCT Pub. No.: WO2017/087807
PCT Pub. Date: May 26, 2017

(65) Prior Publication Data
US 2021/0197691 A1    Jul. 1, 2021

Related U.S. Application Data

(60) Provisional application No. 62/257,654, filed on Nov. 19, 2015.

(51) Int. Cl.
*B60L 3/12* (2006.01)
*H01M 10/48* (2006.01)
(Continued)

(52) U.S. Cl.
CPC .............. *B60L 3/12* (2013.01); *B60L 50/64* (2019.02); *B60L 58/12* (2019.02); *B60L 58/16* (2019.02);
(Continued)

(58) Field of Classification Search
CPC .. B60L 3/12; B60L 50/64; B60L 58/12; B60L 58/16; G01R 31/392; H02J 7/0048; H01M 10/48
(Continued)

(56) References Cited

U.S. PATENT DOCUMENTS 4,038,634 A * 7/1977 Caliri .................. G07C 5/0833
340/459
6,783,888 B2 8/2004 Gan et al.
(Continued)

FOREIGN PATENT DOCUMENTS

WO    2016135992 A1    9/2016

OTHER PUBLICATIONS

European Patent Office, Extended European Search Report, Application No. 16867226.9, dated Jul. 8, 2019, 13 pages.
(Continued)

*Primary Examiner* — Lee E Rodak
*Assistant Examiner* — Trung Q Nguyen
(74) *Attorney, Agent, or Firm* — Quarles & Brady LLP

(57) ABSTRACT

There is disclosed an electrical device including a battery, and a battery management system. The battery management system includes a controller in electrical communication with a pressure sensor to monitor the state of health of the battery. The controller applies a method for determining the state of health that uses a non-electrical (mechanical) signal of force measurements combined with incremental capacity analysis to estimate the capacity fading and other health indicators of the battery with better precision than existing
(Continued)

methods. The pressure sensor may provide the force measurement signal to the controller, which may determine which incremental capacity curve based on force to use for the particular battery. The controller then executes a program utilizing the data from the pressure sensor and the stored incremental capacity curves based on force to estimate the capacity fading and signal a user with the state of health percentage.

43 Claims, 15 Drawing Sheets

(51) Int. Cl.
    *G01R 31/392*     (2019.01)
    *B60L 50/64*     (2019.01)
    *B60L 58/12*     (2019.01)
    *B60L 58/16*     (2019.01)
    *H02J 7/00*     (2006.01)

(52) U.S. Cl.
    CPC .......... *G01R 31/392* (2019.01); *H01M 10/48* (2013.01); *H02J 7/0048* (2020.01)

(58) Field of Classification Search
    USPC .......................................... 324/95, 425–434
    See application file for complete search history.

(56) References Cited

U.S. PATENT DOCUMENTS

| | | | |
|---|---|---|---|
| 2007/0202405 A1 | 8/2007 | Shizuka et al. | |
| 2009/0079397 A1 | 3/2009 | Ibrahim | |
| 2011/0089907 A1 | 4/2011 | Bhardwaj et al. | |
| 2011/0315070 A1 | 12/2011 | Sun | |
| 2011/0318632 A1 | 12/2011 | Herrmann et al. | |
| 2012/0286739 A1 | 11/2012 | O'Brien, Jr. et al. | |
| 2013/0249494 A1* | 9/2013 | Ju | B60L 58/20 320/134 |
| 2013/0257382 A1 | 10/2013 | Field et al. | |
| 2013/0323554 A1 | 12/2013 | Heubner et al. | |
| 2014/0107949 A1 | 4/2014 | Arnold et al. | |
| 2014/0232411 A1* | 8/2014 | Vaidya | G01R 31/3842 324/426 |
| 2015/0044523 A1* | 2/2015 | Weber | H01M 10/625 429/82 |
| 2015/0048783 A1* | 2/2015 | Albertus | H02J 7/0029 320/134 |
| 2015/0066406 A1* | 3/2015 | Sun | G01R 31/392 702/63 |
| 2015/0160302 A1 | 6/2015 | Xu et al. | |
| 2015/0188198 A1 | 7/2015 | Bonhomme et al. | |
| 2015/0323399 A1 | 11/2015 | Zhao | |
| 2016/0064972 A1 | 3/2016 | Stefanopoulou et al. | |

OTHER PUBLICATIONS

Broussely, et al., Main Aging Mechanisms in Li Ion Batteries, Journal of Power Sources, 2005, 146(1-2):90-96.
Cannarella, et al., Stress Evolution and Capacity Fade in Constrained Lithium-Ion Pouch Cells, Journal of Power Sources, 2014, 245:745-751.
Chiang, et al., Online Estimation of Internal Resistance and Open-Circuit Voltage of Lithium-Ion Batteries in Electric Vehicles, Journal of Power Sources, 2011, 196:3921-3932.
Christensen, et al., Stress Generation and Fracture in Lithium Insertion Materials, J. Solid State Electrochem., 2006, 10:293-319.
Deshpande, et al., Battery Cycle Life Prediction with Coupled Chemical Degradation and Fatigue Mechanics, Journal of the Electrochemical Society, 2012, 159(10):A1730-A1738.
Dubarry, et al., Incremental Capacity Analysis and Close-to-Equilibrium OCV Measurements to Quantify Capacity Fade in Commercial Rechargeable Lithium Batteries, Electrochemical and Solid State Letters, 2006, 9(10):A454-A457.
Dubarry, et al., Identifying Battery Aging Mechanisms in Large Format Li Ion Cells, Journal of Power Sources, 2011, 196(7):3420-3425.
Eddahech, et al., Behavior and State-of-Health Monitoring of Li-Ion Batteries Using Impedance Spectroscopy and Recurrent Neural Networks, Electrical Power and Energy Systems, 2012, 42(1):487-494.
Eddahech, et al., Determination of Lithium-Ion Battery State-of-Health Based on Constant-Voltage Charge Phase, Journal of Power Sources, 2014, 258:218-227.
Feng, et al., Using Probability Density Function to Evaluate the State of Health of Lithium-Ion Batteries, Journal of Power Sources, 2013, 232:209-218.
Forman, et al., Optimal Experimental Design for Modeling Battery Degradation, ASME 2012 5th Annual Dynamic Systems and Control Conference joint with the JSME 2012 11th Motion and Vibration Conference, 10 pages.
Han, et al., A Comparative Study of Commercial Lithium Ion Battery Cycle Life in Electric Vehicle: Capacity Loss Estimation, Journal of Power Sources, 2014, 268:658-669.
Han, et al., A Comparative Study of Commercial Lithium Ion Battery Cycle Life in Electrical Vehicle: Aging Mechanism Identification, Journal of Power Sources, 2014, 251:38-54.
Kim, et al., Optimal Power Management for a Series Hybrid Electric Vehicle Cognizant of Battery Mechanical Effects, American Control Conference (ACC), 2014, pp. 3832-3837.
Lawder, et al., Model-Based SEI Layer Growth and Capacity Fade Analysis for EV and PHEV Batteries and Drive Cycles, Journal of the Electrochemical Society, 2014, 161(14):A2099-A2108.
Lin, et al., Quadruple Adaptive Observer of the Core Temperature in Cylindrical Li-Ion Batteries and Their Health Monitoring, American Control Conference (ACC), 2012, pp. 578-583.
Lin, et al., Online Parameterization of Lumped Thermal Dynamics in Cylindrical Lithium Ion Batteries for Core Temperature Estimation and Health Monitoring, IEEE Transactions on Control System Technology, 2013, 21(5):1745-1755.
Mohan, et al., A Phenomenological Model of Bulk Force in a Li-Ion Battery Pack and Its Application to State of Charge Estimation, Journal of the Electrochemical Society, 2014, 161(14):A2222-A2231.
Mohan, et al., On Improving Battery State of Charge Estimation Using Bulk Force Measurements, ASME 2015 Dynamic Systems and Control Conference, pp. V001T13A010, 7 pages.
Oh, et al., Rate Dependence of Swelling in Lithium-Ion Cells, Journal of Power Sources, 2014, 267:197-202.
Oh, et al., A Novel Thermal Swelling Model for a Rechargeable Lithium-Ion Battery Cell, Journal of Power Sources, 2016, 303:86-96.
Oh, et al., Phenomenological Force and Swelling Models for Rechargeable Lithium-Ion Battery Cells, Journal of Power Sources, 2016, 310:118-129.
Peabody, et al., The Role of Mechanically Induced Separator Creep in Lithium-Ion Battery Capacity Fade, Journal of Power Sources, 2011, 196:8147-8153.
Remmlinger, et al., State-of-Health Monitoring of Lithium-Ion Batteries in Electric Vehicles by On-Board Internal Resistance Estimation, Journal of Power Sources, 2011, 196(12):5357-5363.
Renganathan, et al., Theoretical Analysis of Stresses in a Lithium Ion Cell, Journal of the Electrochemical Society, 2010, 157(2):A155-A163.
Samad, et al., Observability Analysis for Surface Sensor Location in Encased Battery Cells, American Control Conference (ACC), 2015, pp. 299-304.
Samad, et al., Influence of Battery Downsizing and SOC Operating Window on Battery Pack Performance in a Hybrid Electric Vehicle, Vehicle Power and Propulsion Conference (VPPC), 2015 IEEE, pp. 1-6.
Sarre, et al., Aging of Lithium-Ion Batteries, Journal of Power Sources, 2004, 127(1-2):65-71.

(56) References Cited

OTHER PUBLICATIONS

Savitzky, et al., Smoothing and Differentiation of Data by Simplified Least Squares Procedures, Analytical Chemistry, 1964, 36(8):1627-1639.
Schiffer, et al., Strain Derivatives for Practical Charge Rate Characterization of Lithium Ion Electrodes, Journal of the Electrochemical Society, 2016, 163(3):A427-A433.
Troltzsch, et al., Characterizing Aging Effects of Lithium Ion Batteries by Impedance Spectroscopy, Electrochimica Acta, 2006, 51:1664-1672.
Vetter, et al., Ageing Mechanisms in Lithium-Ion Batteries, Journal of Power Sources, 2005, 147(1-2):269-281.
Wang, et al., Degradation of Lithium Ion Batteries Employing Graphite Negatives and Nickel-Cobalt-Manganese Oxide + Spinel Manganese Oxide Positives: Part 1, Aging Mechanisms and Life Estimation, Journal of Power Sources, 2014, 269:937-948.
Weng, et al., On-Board State of Health Monitoring of Lithium-Ion Batteries Using Incremental Capacity Analysis with Support Vector Regression, Journal of Power Sources, 2013, 235:36-44.
Weng, et al., A Unified Open-Circuit-Voltage Model of Lithium-Ion Batteries for State-of-Charge Estimation and State-of-Health Monitoring, Journal of Power Sources, 2014, 258:228-237.
Zhang, et al., Diffusion Induced Stress in Layered Li-Ion Battery Electrode Plates, Journal of Power Sources, 2012, 209:220-227.
Zhang, et al., Numerical Simulation of Intercalation-Induced Stress in Li-Ion Battery Electrode Particles, Journal of the Electrochemical Society, 2007, 154(10):A910-A916.
PCT International Search Report and Written Opinion, PCT/US2016/062782, dated Feb. 16, 2017, 24 pages.

\* cited by examiner

STATE OF BATTERY HEALTH ESTIMATION BASED ON SWELLING CHARACTERISTICS

CROSS-REFERENCE TO RELATED APPLICATIONS

This application represents the national stage entry of PCT International Application No. PCT/US2016/062782 filed Nov. 18, 2016, which claims priority from U.S. Patent Application No. 62/257,654 filed Nov. 19, 2015, the contents of which are hereby incorporated herein by reference for all purposes.

STATEMENT REGARDING FEDERALLY SPONSORED RESEARCH

This invention was made with government support under number DE-AR0000269 awarded by the U.S. Department of Energy. The government has certain rights in the invention.

BACKGROUND OF THE INVENTION

1. Field of the Invention

This invention relates to a system and method for estimating state of health in a battery by determining capacity fading using a force measurement and derived incremental capacity curves based on force.

2. Description of the Related Art

As batteries age over time and use, the electrochemical processes within a battery change with every discharging and charging cycle and as the materials degrade. The state of health (SOH) of a battery is a measure (usually expressed as a percentage) that indicates the condition of a battery and its ability to deliver its specified performance compared to when it was new, i.e., at an SOH of 100%. Knowing the SOH of a battery is important for determining whether the battery may still be relied upon for a specific performance and if so, for how much longer. For example, lithium-ion batteries have been one of the most popular choices for use as power sources in electric vehicles (EVs) and hybrid electric vehicles (HEVs). Their popularity is due to their high energy and power densities and their ability to achieve long driving ranges. However, their performance suffers from aging and degradation mechanisms that hinder their efficient performance. Thus, significant research has been focused on trying to understand the aging mechanisms in lithium-ion cells in an effort to improve the utilization and reliability of these cells.

The SOH measurement can be estimated using the internal resistance growth, or the capacity fading of a battery. Prior battery SOH monitoring techniques have relied on voltage measurements. In one such technique, referred to as cyclic voltammetry, the electrode potential is ramped linearly versus time. The resulting cyclic voltammogram shows the peak anodic and cathodic currents, and the shift in these peaks is correlated with aging. In another such technique, a statistical method is applied to the charge/discharge voltage data of a cell to extract a probability density function curve. As the cell degrades, the curve shifts allowing for aging detection. In yet another such technique, known as the differential voltage method, the differential voltage over capacity with respect to capacity is plotted, and the shifts in peaks is correlated with aging.

Finally, one of the most recent techniques, referred to as incremental capacity analysis (ICA), takes advantage of the fact that many cells are characterized by a voltage plateau for a wide range of states of charge (SOCs). Voltage and capacity measurements for a battery type are used to derive an incremental capacity (IC) curve that indicates a peak capacity and from which the capacity fading (and thus, the SOH) for a battery of the same type may be determined. Specifically, this method plots the incremental capacity over voltage (dQ/dV) with respect to voltage, which shows clearly identifiable peaks that correlate with capacity fading. Using this method, the capacity fading may be predicted with a less than 1% error. See, for example, U.S. Patent Application Publication No. 2015/0066406.

Although the ICA method using voltage measurements (ICV) has been shown to be accurate in estimating capacity fade, it still has some major setbacks. First, this method is sensitive to voltage measurements. In some battery chemistries, like lithium iron phosphate, the voltage curves are characterized by a plateau for a wide range of SOCs. Therefore, computing the differential of the voltage may be corrupted by noise. This means that extensive post processing has to be performed to extract the exact shape of the voltage differential curve. Second, for some batteries, including but not limited to lithium-ion nickel-manganese-cobalt oxide cells, the peaks on the voltage IC curve in discharge are centered about 40% state of charge (SOC). This means that in order to estimate and monitor capacity fading and SOH, a battery must be discharged into the lower SOC range. In certain applications, such as an urban electric vehicle or mobile electronic device, it is more likely that a battery discharges into the 70% SOC range rather than the 40% SOC range. As a result, SOH monitoring may happen infrequently using an incremental capacity analysis method that relies on voltage measurements.

Thus, what is needed is an improved system and method for accurately estimating the state of health of a battery.

SUMMARY OF THE INVENTION

In lithium-ion batteries, charging causes a volume change or swelling of the electrodes as the lithium ions intercalate in the negative electrode. In applications where the batteries are constrained or compressed to prevent expansion, the swelling causes a strain or stress, which may be measured using a force sensor (or strain gauge). These force measurements may be used in the incremental capacity analysis (ICA) method of the present disclosure to derive incremental capacity (IC) curves based on force due to the change in volume or swelling. Using the ICA method based on force measurements (ICF) is advantageous because the non-electrical (mechanical) signal from the force due to volume change or swelling includes less noise and exhibits less flatness than the voltage curves, thus making data processing easier.

Further, for some battery chemistries, including but not limited to lithium-ion nickel-manganese-cobalt oxide cells, the identifiable peaks in the IC curves may be centered about 40% SOC. This means that the battery may remain in the higher SOC range and does not have to discharge all the way down to the lower SOC range in order to provide data for an accurate state of health (SOH) estimation. In this way, SOH monitoring may happen more frequently within the regular use of certain applications, such as an urban electric vehicle or mobile electronic device, because it is more likely that a battery discharges into the 70% SOC range than the 40% SOC range.

In one aspect, the invention provides a method of using a non-electrical (mechanical) signal in the incremental capacity analysis method to determine the state of health of a battery. Specifically, this method uses force measurements to derive the incremental capacity curves instead of voltage measurements.

In another aspect, the invention provides a system that uses force measurements in the incremental capacity analysis method to determine the state of health of a battery discharging most often in the upper state of charge range. This provides a more accurate state of health percentage for a battery that is charged often before completely discharging, in which the state of health may be degrading more quickly due to the repetitive charge-discharge cycles in the upper state of charge range.

In another aspect, the invention provides a battery management system (BMS) that uses force measurements to estimate the SOH of a battery based on derived IC curves which indicate the capacity fading. The BMS may indicate to a user the SOH, a pre-failure warning, an expected lifetime, and an anticipated replacement date for the battery. The invention minimizes any noise in the results and uses measurements taken in the upper SOC range.

These and other features, aspects, and advantages of the present invention will become better understood upon consideration of the following detailed description, drawings and appended claims.

DETAILED DESCRIPTION OF THE INVENTION

Much focus has been directed toward the ability to monitor capacity fade in batteries. One prior approach to monitoring capacity fade is the incremental capacity analysis (ICA) method, which plots the differential of the capacity over the differential of voltage versus voltage. These plots result in identifiable peaks at certain voltages. As the cell degrades, these peaks shift with voltage resulting in an identifiable relationship between those peaks and capacity fading of the cell. However, this approach has some setbacks. First of all, some lithium ion chemistries are characterized by flat voltage curves for a wide range of SOC. This makes computing the differential of voltage sensitive to voltage sensor noise (since dV is small, nearly 0). Second of all, the identifiable peaks in the IC curves, for some battery chemistries, are centered about 40% SOC. The present disclosure identifies an alternative method for using the ICA method with a non-electrical signal, instead of voltage, that may be used in capacity fading identification, or more specifically, using force measurements to correlate with capacity fading. This method may be used in implementing state of health (SOH) monitoring prognostic algorithms in a battery management system (BMS), and can be used to supplement or replace current SOH monitoring techniques.

Figure 1:
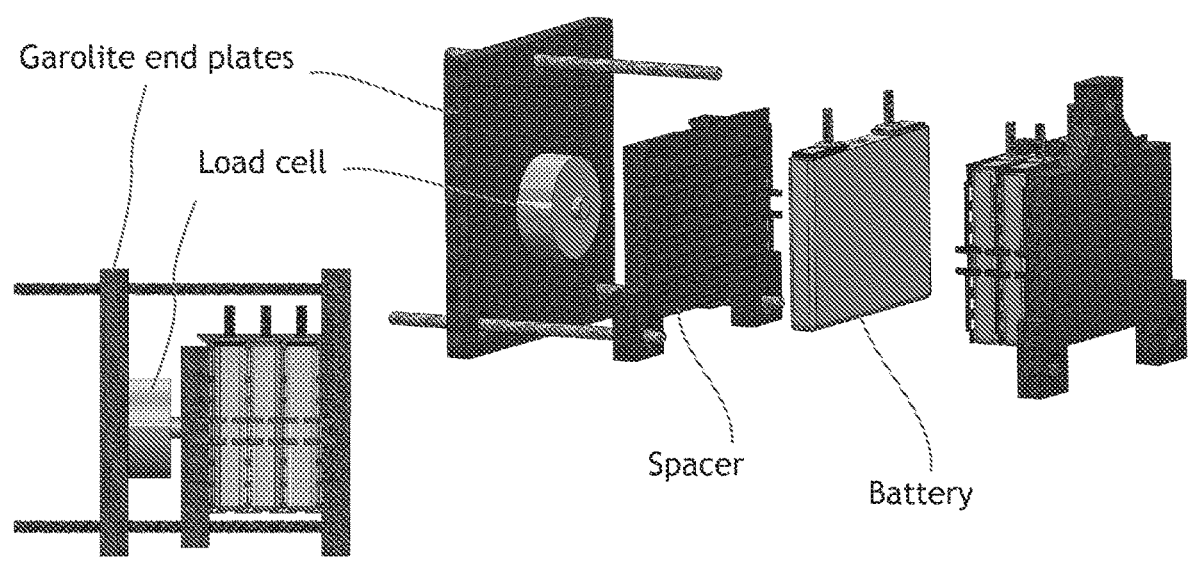
FIG. 1 shows a schematic of three lithium-ion cells sandwiched between two end plates, where the end plate includes a load cell to measure the force due to cell expansion.

A battery management system may include a controller, and may be used in an electrical device including a battery and a pressure sensor. The battery may comprise a battery pack including a series of battery cells arranged with spacers and end plates as shown in FIG. 1. The battery cells may have the chemical properties such that the cells change volume or swell when charging and discharging. The end plates and spacers may apply a certain amount of force to the battery cell arrangement in order to prevent an over expansion of the cells. The pressure sensor may be located at one of the end plates and may be configured to send a force measurement signal to the controller indicating an amount of force applied due to the volume change or swelling of the battery cells.

The controller may include memory storage which may store certain incremental capacity curves based on the force measurements of different battery types. The force incremental capacity curves may be derived by battery manufacturers in order to provide an algorithm for the battery management system to use in order to calculate the state of health of the battery based on the force measurement from the pressure sensor. The algorithms may include linear and/or non-linear relationships between the force, state of charge, voltage, and state of health. The force incremental capacity curves may be derived for different batteries based on the chemical ingredients, structure, initial force applied by the spacers and end plates, initial state of charge, initial capacity, and type of current profile applied during charge-discharge cycles.

The controller may perform state of health monitoring each time the battery pack discharges past a certain threshold state of charge. The certain threshold state of charge may be in the upper state of charge range. For example, the battery management system may perform a state of health analysis every time the battery traverses a 70% state of charge, or a 60% state of charge, or a 50% state of charge. This may be advantageous in vehicles or mobile devices used in urban areas that are less often discharged below a 40% state of charge. Moreover, the more frequent state of health analysis may be useful in such devices as mentioned since batteries which undergo frequent charge-discharge cycles in the upper state of charge range may have a faster rate of state of health degradation.

In one embodiment, the invention provides an electrical device comprising a battery; a sensor for measuring swelling of the battery; and a battery management system including a controller in electrical communication with the sensor (e.g., a pressure sensor). The controller is configured to execute a program stored in the controller to determine a state of health percentage or other diagnostic signals of the battery based on a force incremental capacity curve and a reading from the sensor. The controller may be configured to execute the program stored in the controller to output a pre-failure warning signal for the battery. The controller may be configured to execute the program stored in the controller to output an expected lifetime signal for the battery. The controller may be configured to execute the program stored in the controller to output an anticipated replacement date signal for the battery. The controller may be configured to execute the program stored in the controller to output a signal associated with the state of health or other diagnostic signals to be used in the battery management system. The state of health or other diagnostic signals can be selected from: (i) capacity fade, or (ii) resistance growth, or (iii) expected lifetime signal, or (iv) anticipated replacement date, or (v) pre-failure warning.

The battery may comprise a single cell or a battery pack including a plurality of cells, such as prismatic cells, or cylindrical cells, or pouch cells. Each cell may comprise a positive electrode selected from lithium nickel manganese cobalt oxide, lithium manganese oxide, and lithium iron phosphate; and a negative electrode selected from graphite, lithium titanate, hard carbon, tin/cobalt alloy, and silicon carbon; and an electrolyte selected from $LiPF_6$, $LiBF_4$, and $LiClO_4$. In one form, the battery is a lithium ion battery pack. The battery may comprise a plurality of cells held in compression between a first plate and an opposed second plate. An inner side of the first plate may be in contact with a first end of the plurality of cells, and an inner side of the second plate may be in contact with a second end of the plurality of cells.

The sensor may be selected from (i) a sensor that measures stress, pressure, or force, (ii) a sensor that measures strain, or displacement, or (iii) a sensor that measures any form of physical deformation. In one form, the sensor is a pressure sensor. The physical deformation can be measured using a hydraulic or mechanical or piezoelectric or optical device. The sensor may be a load cell, and the load cell may be adjacent an outer side of the first plate. The sensor may include a plurality of sensors. The battery may be packaged with the sensor(s). The reading (e.g., a pressure reading) from the sensor (e.g., a pressure sensor) may be taken during charge or discharge of the battery.

In another embodiment, the invention provides a vehicle comprising any version of the electrical device of the present disclosure, wherein the electrical device is configured to supply electrical power to propel the vehicle, or to supplement propulsion or electric load in the vehicle. The vehicle may comprise an internal combustion engine, a generator, and a fuel tank storing fuel, wherein the internal combustion engine is configured to combust the fuel from the fuel tank to power the generator, and wherein the generator is configured to supply electrical power to the battery pack. The invention may also provide a consumer electronics apparatus comprising any version of the electrical device of the present disclosure.

In yet another embodiment, the invention provides a battery management system for a battery including a sensor (e.g., a pressure sensor) for measuring swelling of the battery. The battery management system may comprise a controller in electrical communication with the sensor, wherein the controller is configured to execute a program stored in the controller to determine a state of health percentage or other diagnostic signals of the battery pack based on a force incremental capacity curve and a reading from the sensor. The controller may be configured to execute the program stored in the controller to output a pre-failure warning signal for the battery. The controller may be configured to execute the program stored in the controller to output an expected lifetime signal for the battery. The controller may be configured to execute the program stored in the controller to output an anticipated replacement date signal for the battery. The controller may be configured to execute the program stored in the controller to output a signal associated with the state of health or other diagnostic signals to be used in the battery management system. The state of health or other diagnostic signals can be selected from: (i) capacity fade, or (ii) resistance growth, or (iii) expected lifetime signal, or (iv) anticipated replacement date, or (v) pre-failure warning.

The force incremental capacity curve may be derived by: (i) measuring a force indicative of swelling within a reference battery over a time period of charge or discharge, wherein the battery is a same type as the reference battery; and (ii) taking the derivative of a charge or discharge capacity with respect to force. The force incremental capacity curve may be derived by: (i) measuring a force indicative of swelling within a reference battery over a time period of charge or discharge, wherein the battery is of the same type as the reference battery; (ii) taking the derivative of a charge or discharge capacity with respect to force; and (iii) quantifying peaks or location of peaks of the force incremental capacity curve. Taking the derivative of the charge or discharge capacity with respect to force may include first processing data of measured force over the time period of charge or discharge by applying a post processing technique. The post processing technique may include: (i) applying a filter, or (ii) smoothening and averaging, or (iii) using statistical methods.

In the battery management system, the controller may be configured to execute the program stored in the controller to output a signal associated with the state of health or other diagnostic signals to be used in the battery management system. The state of health or other diagnostic signals can be selected from: (i) capacity fade, or (ii) resistance growth, or (iii) expected lifetime signal, or (iv) anticipated replacement date, or (v) pre-failure warning.

The sensor may be selected from (i) a sensor that measures stress, pressure, or force, (ii) a sensor that measures strain, or displacement, or (iii) a sensor that measures any form of physical deformation. The physical deformation can be measured using a hydraulic or mechanical or piezoelectric or optical device. The pressure sensor may be a load cell, and the load cell may be adjacent an outer side of the first plate. The pressure sensor may include a plurality of pressure sensors. The pressure reading from the pressure sensor may be taken during charge or discharge of the battery. A reading from a sensor can be taken during charge or discharge of the battery.

In still another embodiment, the invention provides a method for determining a state of health percentage of a battery. The state of health may be capacity fading, or resistance growth. The method may include the steps of: (a) determining a force incremental capacity curve to use based on the battery pack; (b) sensing a force indicative of swelling within the battery pack; and (c) determining the state of health percentage of the battery based on the force indicative of the swelling and the force incremental capacity curve. The force incremental capacity curve may be derived by: (i) measuring a force indicative of a swelling within a reference battery over a time period of charge or discharge, wherein the battery is of the same type as the reference battery; and (ii) taking the derivative of a charge or discharge capacity with respect to force. The force incremental capacity curve may be derived by: (i) measuring a force indicative of swelling within a reference battery over a time period of charge or discharge, wherein the battery pack is of the same type as the reference battery; (ii) taking the derivative of a charge or discharge capacity with respect to force; and (iii) quantifying peaks or locations of peaks of the force incremental capacity curve. Taking the derivative of the charge or discharge capacity with respect to force may include first processing data of the measured force over the time period of charge or discharge by applying a post processing technique. Applying the post processing technique may include using a filter, smoothing or averaging the data, or using statistical methods.

An electrical device of the invention including a battery and a battery management system has many uses. In one non-limiting example, the electrical device includes a battery pack and a battery management system, and the device is used in electric vehicles. Hybrid electric vehicles use both high voltage battery power for traction, and an internal combustion engine for propulsion and for battery charging via a generator. Plug-in electric vehicles can be charged from an external source of electricity, and the stored energy is used to power the vehicle. Battery management systems for electric vehicles may include an electronic controller to monitor various parameters associated with the operation of the battery pack. For example, temperature, pressure, current, voltage, capacity, volume change, swelling, and so forth can be monitored by the controller of the battery management system. It is possible for the battery management system to predict state of health using the methods of the present disclosure. The battery management system can calculate state of health through the use of a controller. Force can be used as a variable in a programmed algorithm run by a processor of the controller, which in turn produces a state of health estimate.

EXAMPLES

The following Examples are provided in order to demonstrate and further illustrate certain embodiments and aspects of the present invention and are not to be construed as limiting the scope of the invention.

Prior health monitoring techniques in batteries relied on voltage measurements. The Examples demonstrate a novel method of using a non-electrical (mechanical) signal in the ICA method. The method demonstrated in the following examples utilizes measurements of force to derive incremental capacity curves based on force (ICF) instead of voltage (ICV). The force is measured on the surface of a cell under compression in a fixture that replicates a vehicle battery pack. The analysis in the Examples is done on Lithium ion Nickel-Manganese-Cobalt Oxide (NMC) cells. For some chemistries, the ICF method can complement or replace the ICV method for the following reason. The identified ICV peaks are centered around 40% state of charge (SOC) while that of the ICF method are centered around 70% SOC. This means it can be used more often because it is more likely that an electric vehicle (EV) or a plug-in hybrid electric vehicle (PHEV) transverses the 70% SOC range than the 40% SOC.

Four different fixtures were tested under different SOC and preloading conditions. All fixtures seem to exhibit the same behavior with a linear decrease of capacity with increasing force IC peak voltage value. Results show that the mean capacity of each fixture can be estimated with a maximum error of 2.5% over 6200 charge-discharge cycles. Also, it has been shown that bulk force measurements can be used to estimate individual cell capacities. Results show that the maximum error is 3.1% with an average and standard deviation on the error of −0.42% and 1.14% respectively.

Example 1

Experimental Setup

In an experiment using the disclosed SOH monitoring method, the ICA method was done on lithium-ion nickel-manganese-cobalt oxide cells setup as they might be arranged in a battery pack for a hybrid electric vehicle (HEV). The force was measured on the surface of a cell under compression in a fixture that replicates a vehicle battery pack. In order to simulate an HEV battery pack, four fixtures were fabricated consisting of three lithium ion batteries each. FIG. 1 shows one of these fixtures. The battery was 120×85×12.7 mm with a 5 amp-hour (Ah) nominal capacity. A flat-wound jelly roll was encased inside the aluminum hard shell of the battery. The jelly roll did not fill the whole enclosure and thus there were air gaps around the sides and the top of the cell. The structure of the jelly roll resulted in electrode expansion in the direction perpendicular to its largest face. The cells were separated by a plastic spacer with dimples on it to allow for air to flow between the cells for cooling purposes and also maintain compression between the batteries. A set of four arrays of resistance temperature detectors (RTDs) were instrumented on one side of the middle battery of each of the four fixtures. Each array had four RTDs totaling 16 sensors in each fixture. The RTDs allowed for spatial surface temperature measurement of the middle cell as it was being cycled. These RTDs have been shown to be faster at estimating the core temperature of the battery as compared to a conventional thermistor sensor placed close to the tabs of the battery. Two Garolite (a fiberglass-epoxy composite) end plates were used to clamp the three battery cells together using bolts with lock nuts to prevent the fixture from loosening. A load cell was also installed for measuring the force due to cell expansion. The end plates were bolted together while the middle Garolite plate was free to move along the axes of the bolts. Between one of the end Garolite plates and the cells, a 500 lb. (LC305-500) Omega load cell sensor (strain gauge type) was instrumented to measure the resulting force when the cells are being cycled. The fixtures were meant to replicate an electric vehicle and plug-in hybrid electric vehicle battery pack where the cells are constrained in an array with fixed length. Also, the four different fixtures were intended to test the effect of the nominal operating SOC and initial preloading conditions on the degradation rates of cells. The fixtures were placed in a thermal environmental chamber for ambient temperature control.

The four identical fixtures were used to test degradation at different SOCs and initial preloading conditions. Capacity fade has been shown to be slower at lower SOCs. Also, operation at higher SOCs was shown to result in higher bulk stresses on the battery. In turn, aging related mechanisms are shown to be coupled to mechanical effects. As such, Table 1 shows the nominal SOC and preloading force recorded for all four fixtures. The nominal SOC is defined as the SOC at which the cell is being cycled, and the preload is the initial force that is used to clamp the cells before any degradation experiments. The preload was set at an initial SOC of 50% at 25° C. for all four fixtures. During the first stage of the experiment, fixtures {1, 2, 3, 4} were set to an initial SOC of {33, 50, 66, 50} % and a preload of {168, 168, 168, 334} lbs., respectively. During the second stage of the experiment, fixtures {1, 2, 3, 4} were set to an initial SOC of {40, 50, 60, 50} % and a preload of {168, 168, 168, 334} lbs.

TABLE 1

SOC and preload conditions for all 4 fixtures

| | Fixture 1 | Fixture 2 | Fixture 3 | Fixture 4 |
|---|---|---|---|---|
| SOC [%] (first stage/second stage) | 33/40 | 50/50 | 66/60 | 50/50 |
| Current scaling factor | 1/1.3 | 1/1.3 | 1/1.3 | 1/1.3 |
| Preload [lbs] | 168/168 | 168/168 | 168/168 | 334/334 |
| Ambient Temperature [° C.] | 10/25 | 10/25 | 10/25 | 10/25 |

Figure 11:
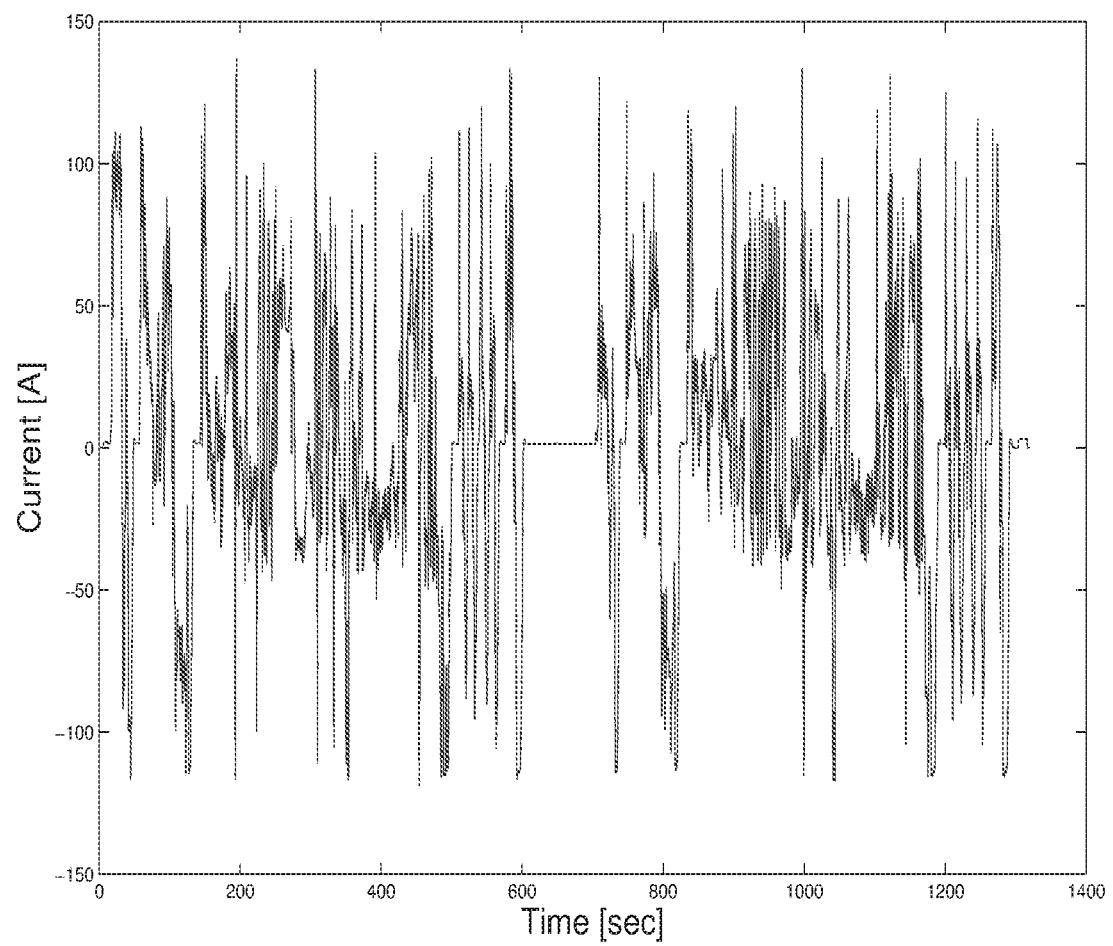
FIG. 11 shows the US06 current profile used for the degradation experiments.

A charge-sustaining charge-discharge cycle was applied for 900 cycles continuously to the cells using a US06 current profile extracted from a Ford hybrid electric vehicle, as shown in FIG. 11. The current profile is the result of the hybrid power split. The following details the procedure for the US06 cycling:

Set thermal chamber ambient temperature to 25° C.

Charge all cells at 1 C (5 A) rate using a constant-current constant-voltage protocol to 4.1 V (corresponding to 100% SOC), until the current reaches 0.05 A.

Discharge fixtures {1, 2, 3, 4} to {33, 50, 66, 50} % initial SOCs (or {40, 50, 60, 50} % during second stage).

Set thermal chamber ambient temperature to 10° C. (or to 25° C. for the second stage).

Rest for one day.

Apply US06 current profile for 900 cycles (scaling the current by a factor of 1.3 during the second stage).

Proceed to capacity measurement.

The first stage of the degradation experiment with a scaled down current profile lasted for approximately 3500 cycles, while the second stage lasted for approximately 2700 cycles. Since the current was scaled in the second stage, the initial SOCs for fixtures 1 and 3 had to be moved closer to 50% SOC, otherwise voltage limits would be violated due to the high current rates. Since the fixtures are connected in series, this meant that the same current passed through the cells. However, since the fixtures are at different SOCs, the resulting power throughput is different. Table 2 shows the important features of the current profile for both stages of the degradation experiments.

TABLE 2

US06 current profile features during first and second stage experiments

| | First Stage | Second Stage |
|---|---|---|
| Duration [sec] | 1320 | 1320 |
| RMS current [A] | 45 | 60 |
| Max Current [A] | 137 | 178 |
| SOC swing [%] | 20 | 26 |

After the fixtures had been cycled for 900 cycles, a capacity measurement routine was performed for all cells according to the following procedure:

Charge all the cells at a 1 C (5 A) rate using a constant-current constant-voltage protocol to 4.1 V (corresponding to 100% SOC), until the current reaches 0.05 A.

Set thermal chamber ambient temperature to 25° C.

Rest for one day.

Discharge all cells at a 1 C (5 A) rate to 2.9 V (corresponding to 0% SOC).

Record discharging capacity. The capacity of each fixture is the mean capacity of all three cells in the fixture.

Proceed to US06 cycling.

Results

Figure 2:
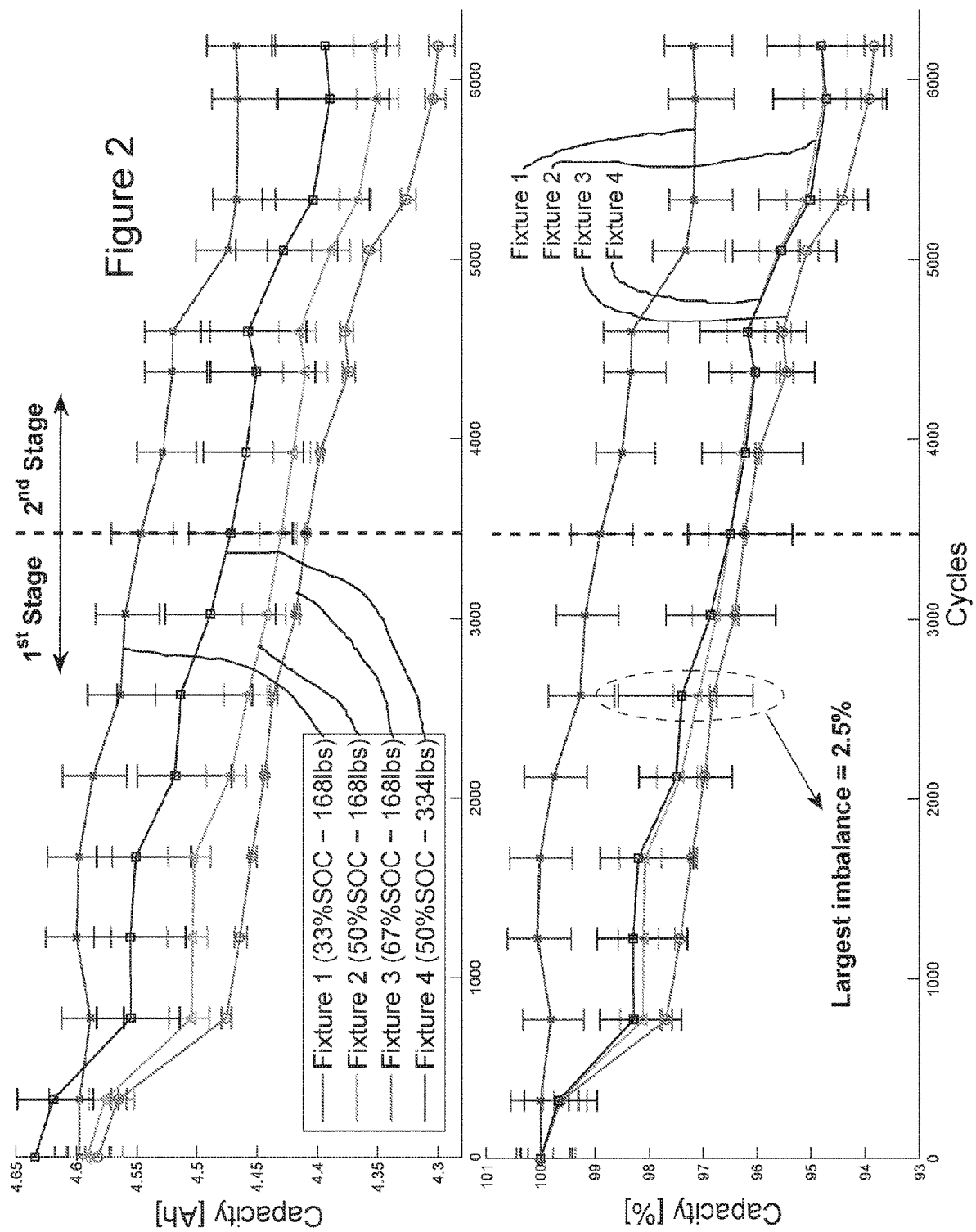
FIG. 2 shows capacity fading as a function of the number of charge-discharge cycles for four different battery fixtures with different operating SOCs and preloading conditions.

The results of the capacity fading are plotted in FIG. 2. Since each fixture had three cells, the average capacity (both absolute and percentage) for each fixture was plotted versus the number of cycles. The dashed vertical line represents the cycle at which the second stage degradation experiment started. Since each fixture is comprised of 3 cells each, a bar is used to represent the span of capacities of each of the 3 cells at each point.

In accordance with research on capacity fading, the results showed that fixture 1 which operated at 33% nominal SOC had the slowest rate of capacity fade, while fixture 3 which operated at the highest SOC (66%) degraded the fastest. Notably, both fixtures 2 and 4, which had the same SOC (50%) but different preloads (168 lbs. and 334 lbs., respectively), showed an almost identical rate of capacity fade. Further, except for fixture 1, all fixtures experienced a significant drop in capacity initially, which may be characteristic of the Lithium-Nickel-Manganese-Cobalt-Oxide (NMC) cell being used.

Figure 3:
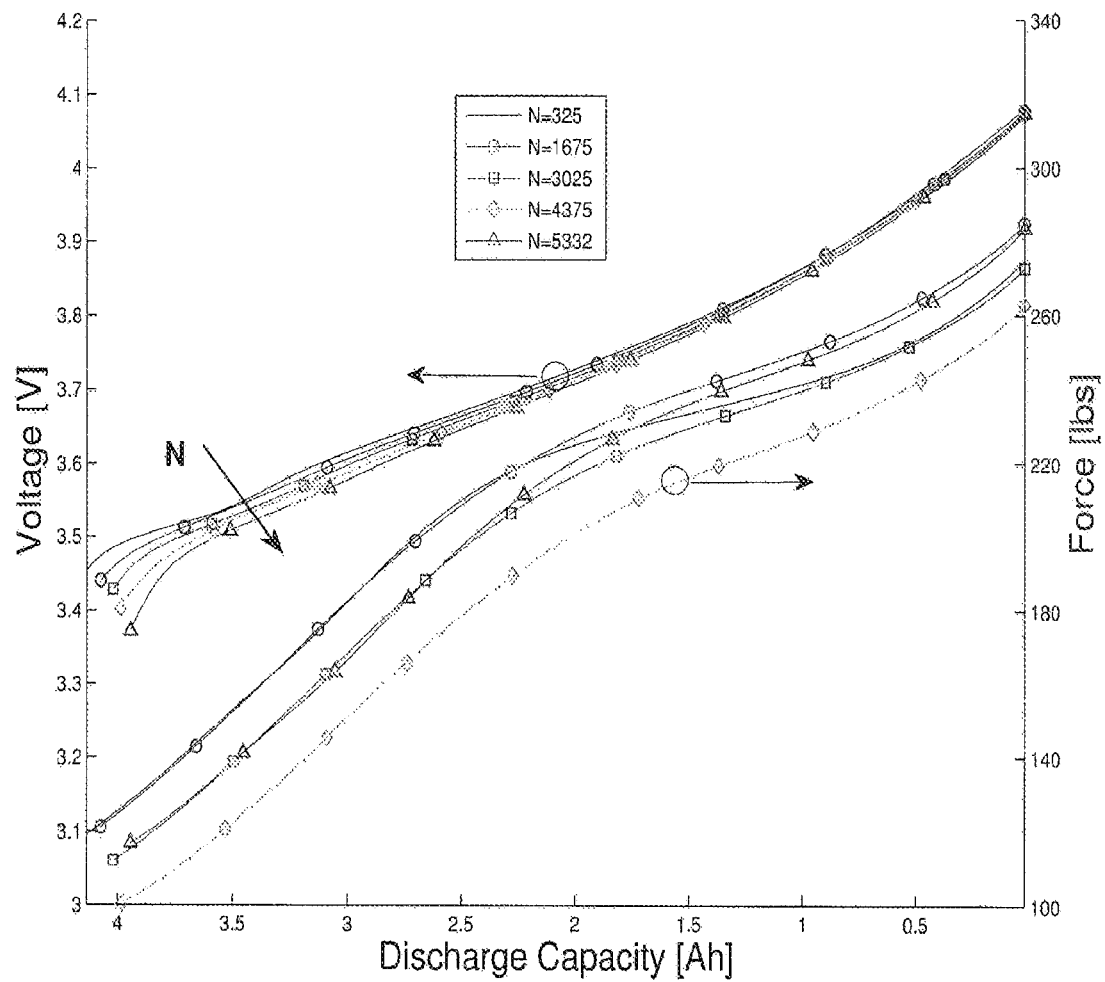
FIG. 3 shows example voltage and force measurements during a discharge capacity test after different numbers (N) of charge-discharge cycles.

FIG. 3 shows the voltage and force plot as a function of discharge capacity during the capacity measurement 1 C discharge test for fixture 1 after differing numbers of charge-discharge cycles. As seen in FIG. 3, the voltage measurements are packed together, however, the corresponding force measurements are spread apart, which could be due to degradation or creep inherent in the fixture. From FIG. 3, the corresponding dV/dQ and dF/dQ curves may be extracted.

Figure 4:
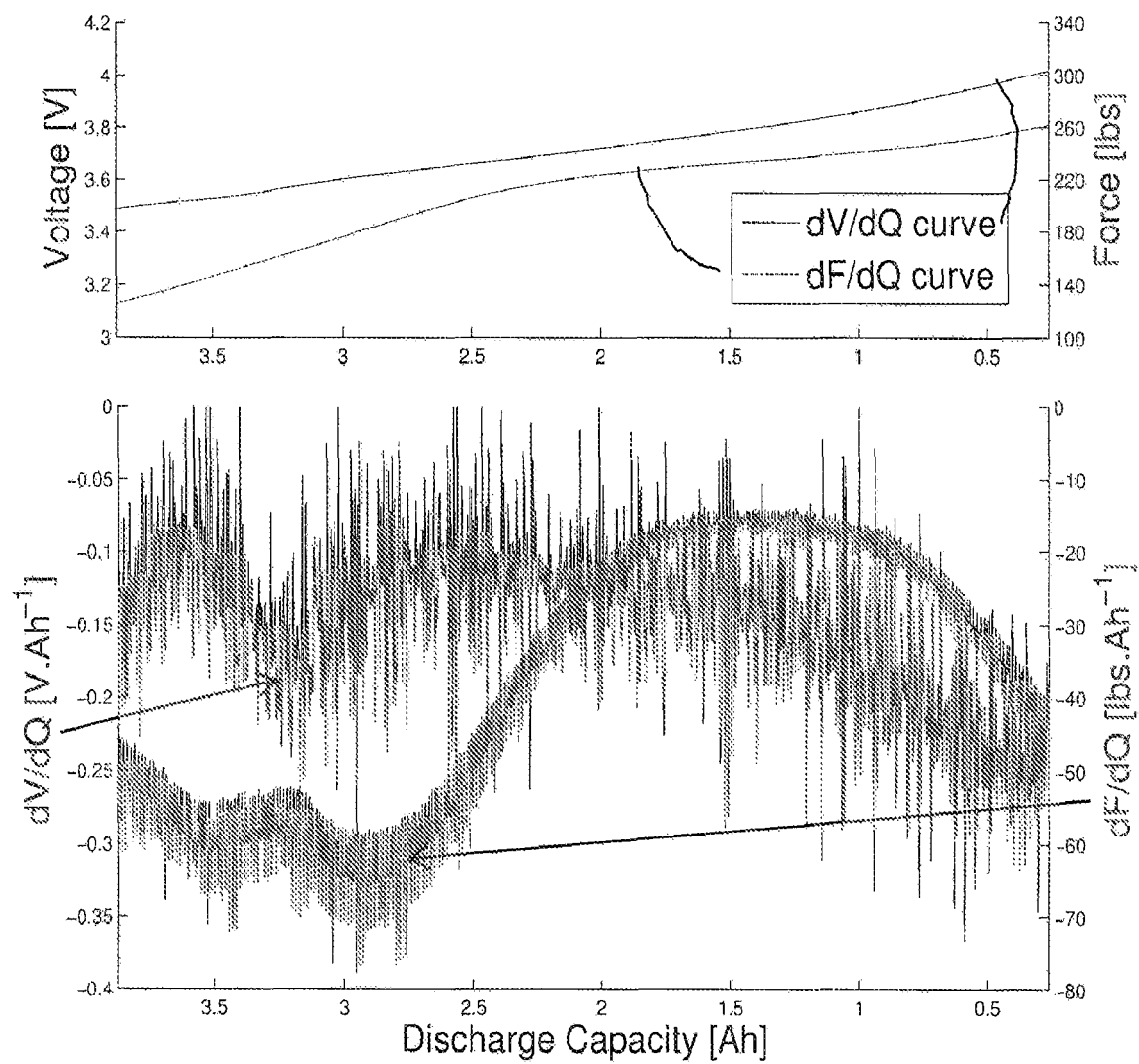
FIG. 4 shows example voltage and force curves and corresponding dV/dQ and dF/dQ curves during a discharge capacity test for a battery fixture after 325 charge-discharge cycles.

FIG. 4 shows the voltage and force curves and their corresponding dV/dQ and dF/dQ curves for fixture 1 after 325 charge-discharge cycles. Even though the voltage and force curves look relatively smooth, their derivatives, dV/dQ and dF/dQ are noisy and require filtering. A Savitsky-Golay (SG) filtering technique was used to process the data. This SG filtering method fits a low order polynomial to successive sets of data using the least squares method, and can improve the signal to noise ratio without affecting or distorting the signal. The SG filter requires the window or frame length (F) and the polynomial order (N) to be specified. N should be both a low polynomial order and considerably smaller than F to prevent the smoothing curve from being fitted to the noise.

Figure 5:
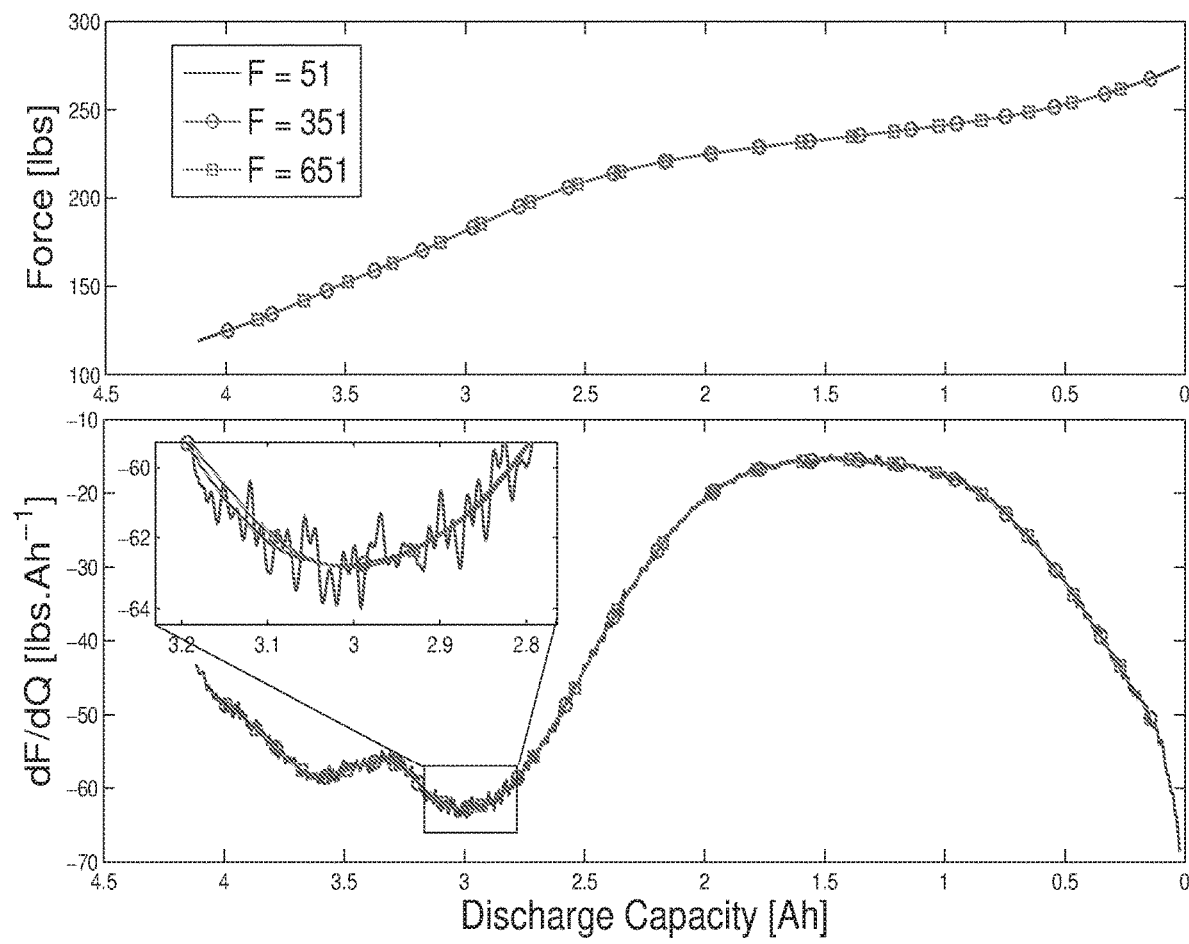
FIG. 5 shows example force and dF/dQ polynomial curve fits using a Savitsky-Golay filter during a discharge capacity test for a battery fixture after 325 charge-discharge cycles for different frame lengths (F).

FIG. 5 shows a plot of the force and the derivative of force with respect to discharge capacity for different frame lengths (F) and for N=3. Notably, the dF/dQ result differed with the frame length even though the force fit curve is similar. For a short frame length, the derivative curve exhibited oscillations indicating that the curve is being fit to noise. As the frame length increases, the derivative curve becomes smoother. For this experiment, F=651 and N=3 were chosen and resulted in a good smooth fit.

Figure 6:
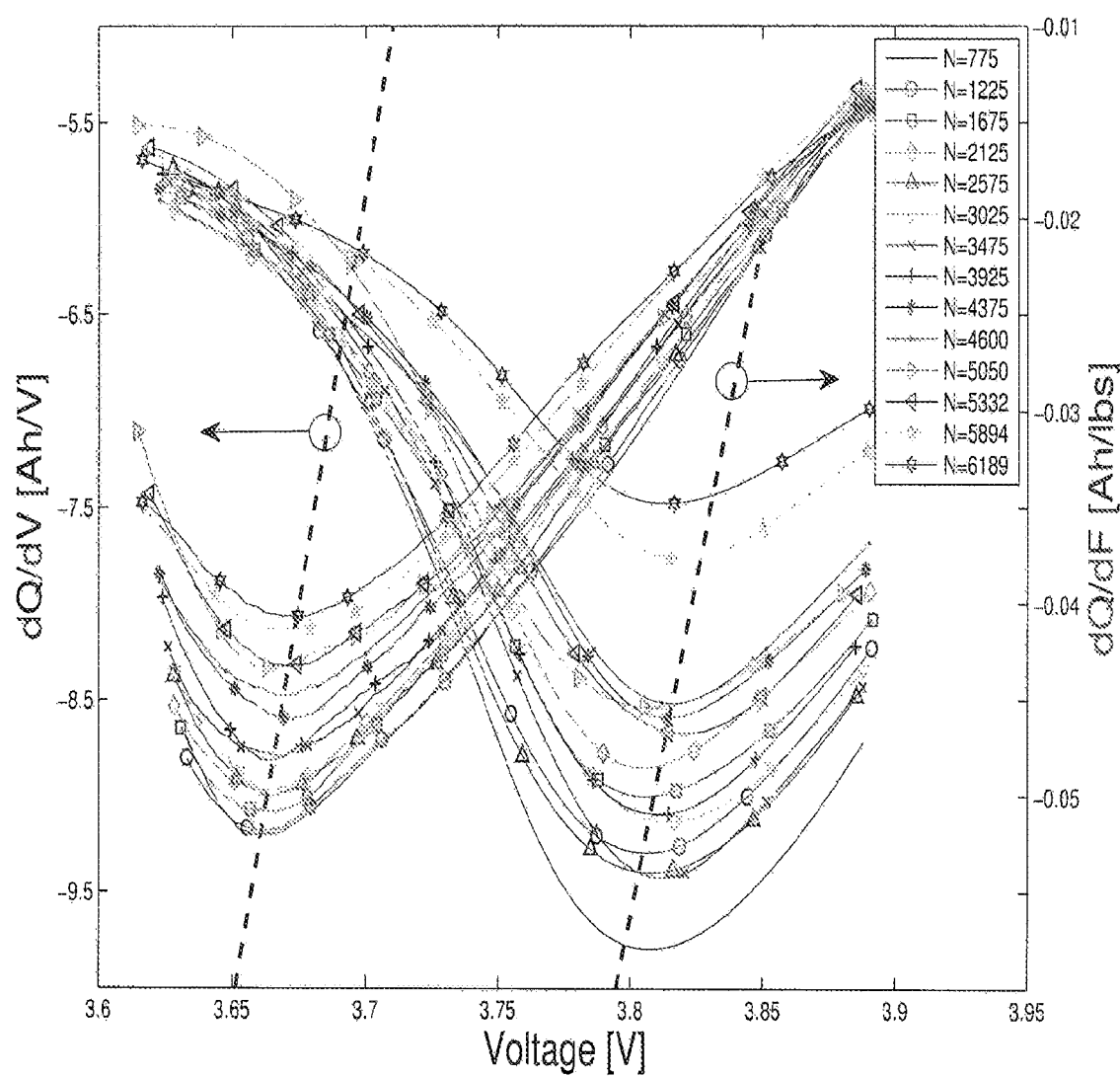
FIG. 6 shows example IC curves using voltage (ICV) and force (ICF) during a discharge capacity test for a battery fixture after different numbers of charge-discharge cycles (N), as well as a linear fit of the corresponding peak values for both sets of curves.

With the new filtered and smoothed data, the IC curves may be plotted for both voltage and force. FIG. 6 shows a plot of the dQ/dV and dQ/dF curves versus voltage for differing numbers of charge-discharge cycles. Both the voltage IC (ICV) curve and the force IC (ICF) curve exhibited the same behavior with shifting peaks as the number of cycles increases. FIG. 6 shows that the identified peaks for the force IC curve are at a higher voltage (and thus, a higher SOC) than the peaks of the voltage IC curve. In addition, since the non-electrical (mechanical) signals from the force measurements are less noisy, the corresponding force IC curves are smoother.

Figure 7:
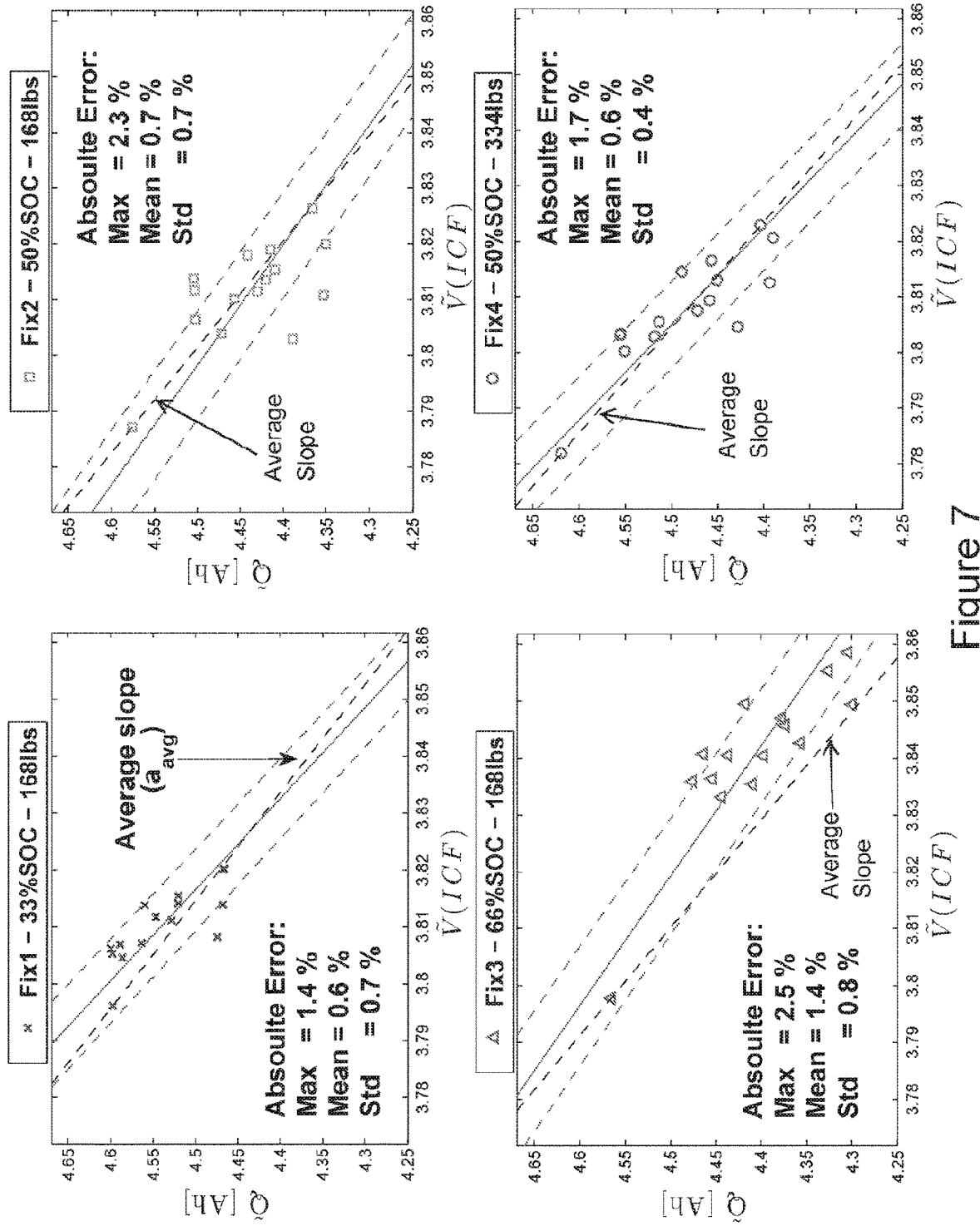
FIG. 7 shows example plots of capacity versus voltage at the peaks of the ICF curves for four battery fixtures with a linear fit solid line with a band of 1% and the average slope fitted through the first data point for each battery fixture, as well as the respective maximum, mean, and standard deviation of the error between the measured capacity and the estimated capacity using the average slope of the battery fixtures.

Finally, the capacity of the cell versus the voltage at which the peak of the force IC curve occurs may be plotted. The data plots in FIG. 7 show a linear trend of capacity fade with shifting ICF curve peaks. The 4 subplots in FIG. 7 show the plots of the data for capacity versus voltage at the peaks of the ICF curves with a linear fit (solid line) with a 1% band (dashed lines other than average slope dashed line). Also using all four fixtures, the average slope was calculated and fit to the first data point of each fixture (average slope lines). The results show that using a linear fit on all data from all 4 fixtures, the estimated capacity difference is 2.5% (worst case). It is envisioned that testing can verify whether a linear fit can be extrapolated to predict continued capacity loss. The preceding analysis in Example 1 describes the ability of this method to estimate the bulk capacity of each fixture using bulk force measurements. However, since each fixture is comprised of three cells each, in the following example, the potential of a bulk force measurement for individual capacity estimation is analyzed.

Example 2

Figure 8:
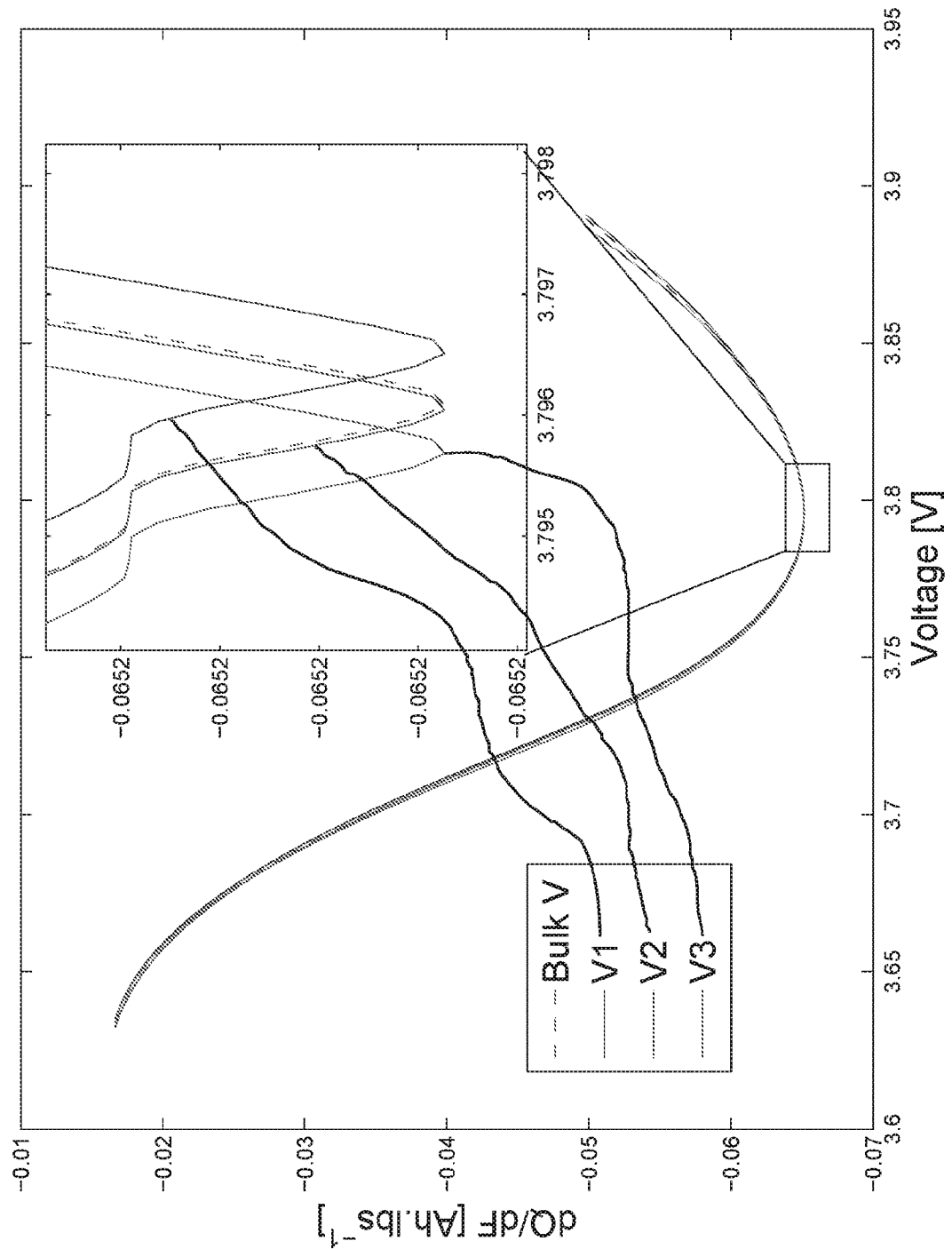
FIG. 8 shows an example ICF curve versus the bulk battery fixture voltage and individual cell voltages for a battery fixture 1 after 325 charge-discharge cycles.

Example 2 is an analysis of the potential of using the bulk force measurements and ICA method of Example 1 to estimate each of the three individual cell capacities within each fixture. FIG. 8 shows the ICF curve versus the bulk and individual cell voltages of the three cells in fixture 1 after 325 cycles. Since the cells have slightly different capacities, the resulting ICF curve has different peak locations for the different cells. Using the average slope of the capacity fade versus the voltage at the peak of the ICF curve, discussed above, a line may be fitted through the initial capacity values of each cell. Accordingly, given the plot of the bulk ICF curve versus each individual cell voltage, one can record the value of the voltage at the peak of the ICF curve for each cell and estimate its respective capacity.

Figure 9:
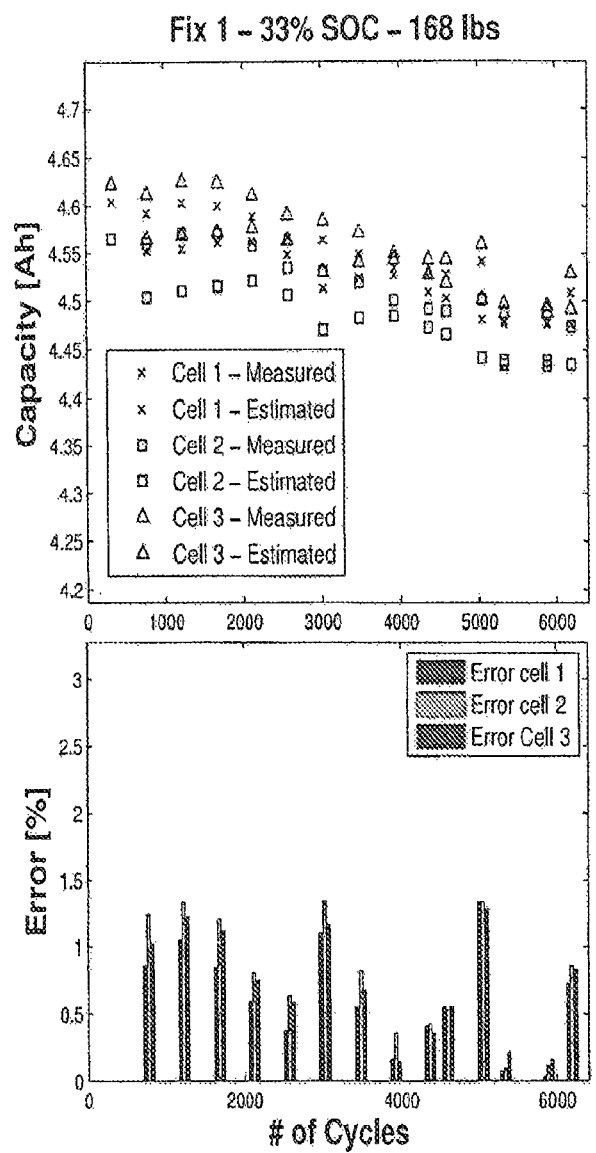
FIG. 9 shows the results of using bulk force measurements to estimate individual cell capacities along with the corresponding errors on measured and estimated capacity.
Figure 9:
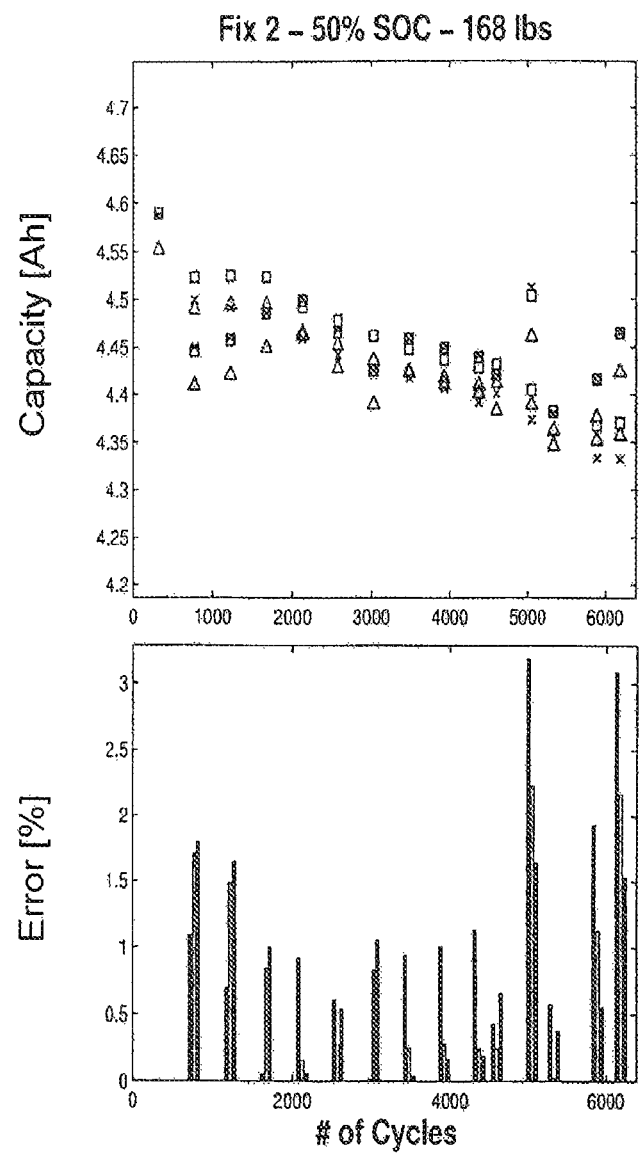
Figure 9:
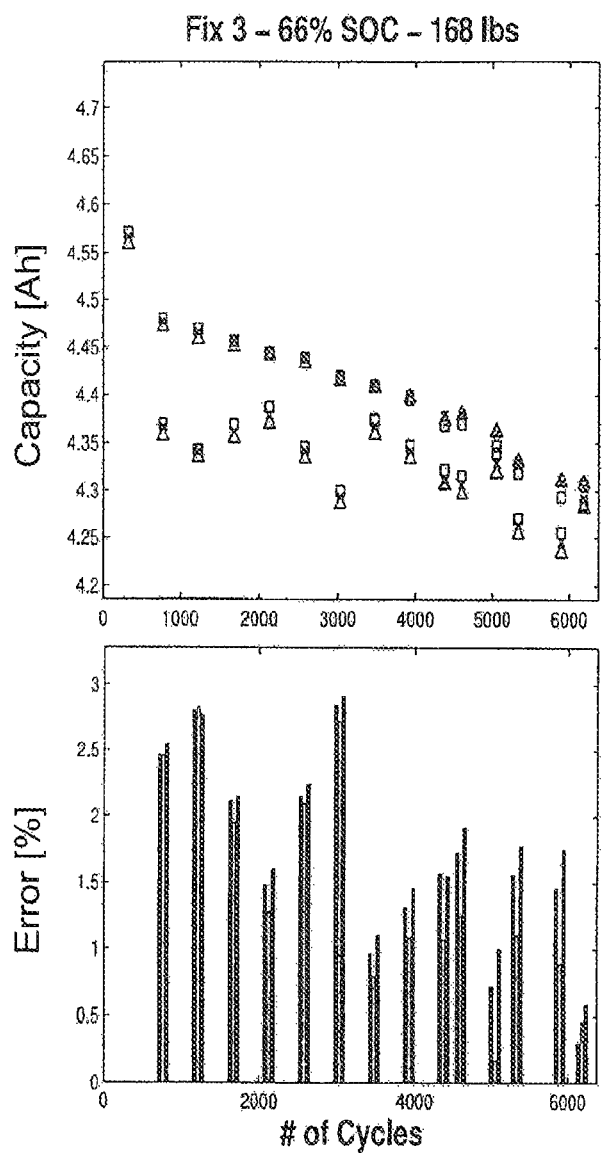
Figure 9:
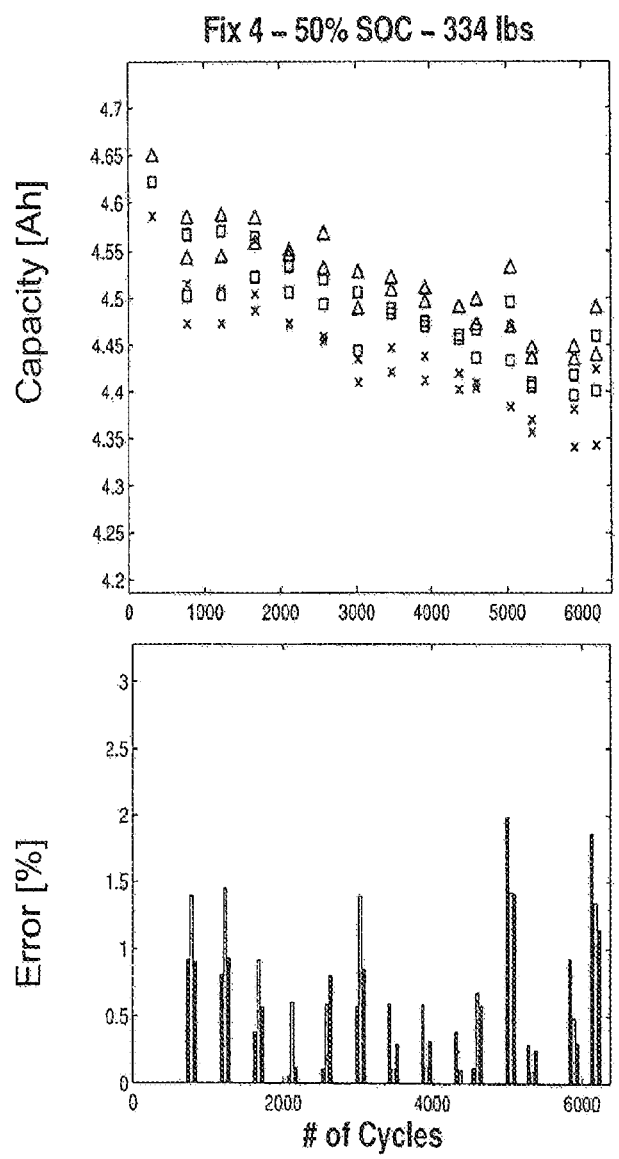
Figure 10:
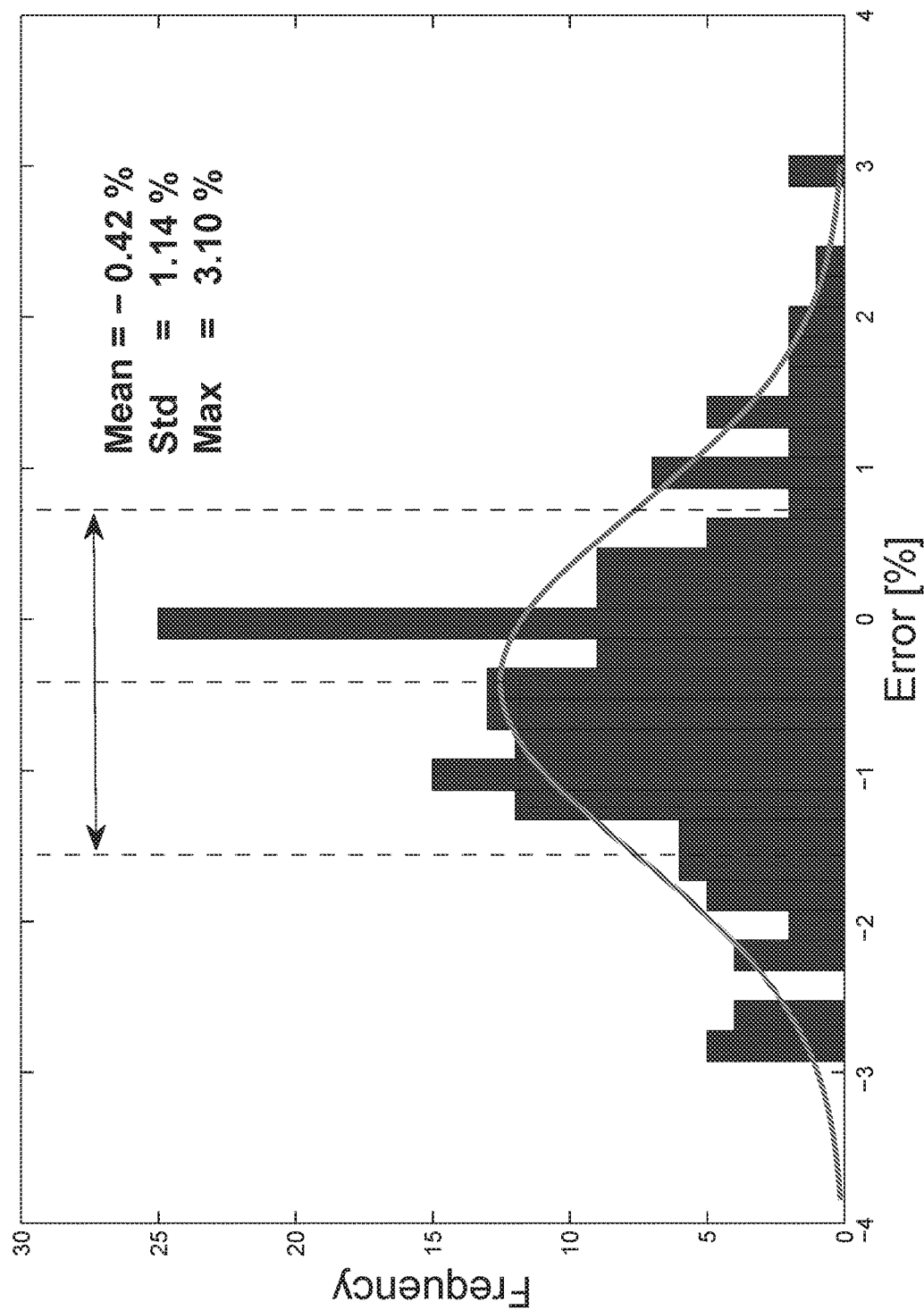
FIG. 10 shows the distribution of the error between the measured and estimated capacities for the cells over 6200 charge-discharge cycles of degradation and the respective maximum, mean, and standard deviation.

FIG. 9 shows the estimated and measured capacity for all of the cells in the four fixtures with the corresponding errors between the measured and estimated capacity. Results show that, over approximately 6200 charge-discharge cycles, the bulk force measurement results may be used to estimate the individual cell capacities. As shown in FIG. 10, the maximum error between the measured and estimated capacities across all fixtures at any given time during the 6200 charge-discharge cycles is 3.1%, while the mean and standard deviation of the error is −0.42% and 1.14%, respectively.

Example 3

Figure 12:
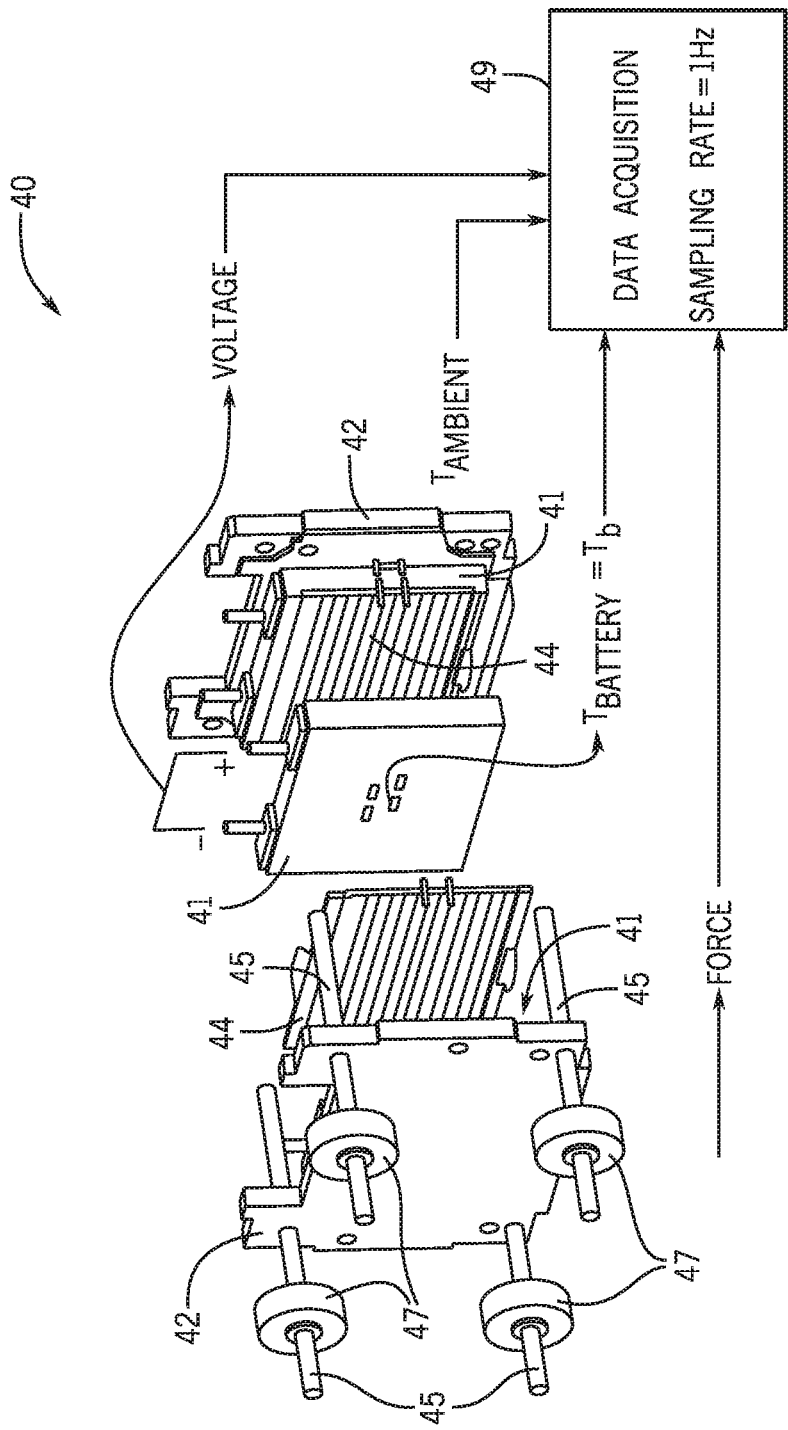
FIG. 12 is a schematic showing an exploded perspective view of another example fixture that can be used in the invention.

FIG. 12 shows an exploded perspective view of another fixture that could be used to estimate State of Health (SOH) in accordance with the present disclosure and also estimate State of Charge (SOC). The fixture 40 shown in FIG. 12 includes three lithium ion nickel-manganese-cobalt (NMC) batteries 41 connected in series placed between two 1-inch thick Garolite (a fiberglass-epoxy composite) plates 42. The Garolite plates 42 allow for parallel placement and compression of the batteries 41 within the fixture 40 with spacers 44 between adjacent batteries 41, and the plates 42 are bolted together using four bolts 45, one in each corner of the plate 42. Each of the four bolts 45 is instrumented with a strain gauge load cell 47. Current excitation can be provided by means of a Bitrode model FTV, and the resulting force and temperature data can be acquired via a strain gauge input module and 18-bit data acquisition card. The battery temperature ($T_{battery}=T_b$), ambient temperature ($T_{ambient}=T_{amb}$), current, voltage, and force can be sampled at a 1 Hz rate as shown at controller 49 in FIG. 12.

Having acquired battery temperature, ambient temperature, current, voltage, and force at controller 49, the controller 49 can execute a stored program to estimate State of Health (SOH) in accordance with the methods of the present disclosure and also estimate State of Charge (SOC) using the methods described in U.S. Patent Application Publication No. 2016/0064972, which is incorporated herein by reference.

Thus, a method of using force in the incremental capacity analysis has been introduced. The method is less susceptible to measurement noise (force curves are less flat than voltage curves). Also, it is able to monitor and estimate capacity fade of a battery at higher SOCs as compared to using voltage in the incremental capacity analysis method. This means that the battery management system does not have to traverse the lower SOCs to get an estimation of the capacity fade. For an NMC cell, results using the ICF method have shown that the peak curves occur at around 70% SOC while those using the ICV method occur at around 40% SOC. Also, four different fixtures were tested under different SOC and preloading conditions. All fixtures seem to exhibit the same behavior with a linear decrease of capacity with increasing ICF peak voltage value. Results show that the mean capacity of each fixture can be estimated with a maximum error of 2.5% over ~95 thousand miles of US06 cycling. Also, it has been shown that bulk force measurements can be used to estimate individual cell capacities. Results show that the maximum error is 3.1% with an average and standard deviation on the error of −0.42% and 1.14% respectively.

REFERENCES

[1] M. Broussely, P. Biensan, F. Bonhomme, P. Blanchard, S. Herreyre, K. Nechev, and R. Staniewicz, "Main aging mechanisms in Li ion batteries," *J. Power Sources*, 146 (12), 90 (2005).
[2] J. Cannarella and C. B. Arnold, "Stress evolution and capacity fade in constrained lithium-ion pouch cells," *J. Power Sources*, 245, 745 (2014).
[3] Y.-H. Chiang, W.-Y. Sean, and J.-C. Ke, "Online estimation of internal resistance and open-circuit voltage of lithium-ion batteries in electric vehicles," *J. Power Sources*, 196(8), 3921 (2011).

[4] J. Christensen and J. Newman, "Stress generation and fracture in lithium insertion materials," *J. Solid State Electr*, 10(5), 293 (2006).

[5] R. Deshpande, M. Verbrugge, Y.-T. Cheng, J. Wang, and P. Liu, "Battery Cycle Life Prediction with Coupled Chemical Degradation and Fatigue Mechanics," *J. Electrochem. Soc.*, 159(10), A1730 (2012).

[6] M. Dubarry, B. Y. Liaw, M.-S. Chen, S.-S. Chyan, K.-C. Han, W.-T. Sie, and S.-H. Wu, "Identifying battery aging mechanisms in large format Li ion cells," *J. Power Sources*, 196(7), 3420 (2011).

[7] M. Dubarry, V. Svoboda, R. Hwu, and B. Yann Liaw, "Incremental Capacity Analysis and Close-to-Equilibrium OCV Measurements to Quantify Capacity Fade in Commercial Rechargeable Lithium Batteries," *Electrochem. Solid St.*, 9(10), A454 (2006).

[8] A. Eddahech, O. Briat, N. Bertrand, J.-Y. Deletage, and J.-M. Vinassa, "Behavior and state-of-health monitoring of Li-ion batteries using impedance spectroscopy and recurrent neural networks," *Int. J. Elec. Power*, 42(1), 487 (2012).

[9] A. Eddahech, O. Briat, and J.-M. Vinassa, "Determination of lithium-ion battery state-of-health based on constant-voltage charge phase," *J. Power Sources*, 258, 218 (2014).

[10] X. Feng, J. Li, M. Ouyang, L. Lu, J. Li, and X. He, "Using probability density function to evaluate the state of health of lithium-ion batteries," *J. Power Sources*, 232, 209 (2013).

[11] J. C. Forman, S. J. Moura, J. L. Stein, and H. K. Fathy, "Optimal Experimental Design for Modeling Battery Degradation," *ASME International*, (October 2012).

[12] S. E. Group, Instrumental Methods in Electrochemistry (Ellis Horwood series in physical chemistry). *Ellis Horwood Ltd*, Publisher, (1985).

[13] X. Han, M. Ouyang, L. Lu, and J. Li, "A comparative study of commercial lithium ion battery cycle life in electric vehicle: Capacity loss estimation," *J. Power Sources*, 268, 658 (2014).

[14] X. Han, M. Ouyang, L. Lu, J. Li, Y. Zheng, and Z. Li, "A comparative study of commercial lithium ion battery cycle life in electrical vehicle: Aging mechanism identification," *J. Power Sources*, 251, 38 (2014).

[15] Y. Kim, S. Mohan, N. Samad, J. Siegel, and A. Stefanopoulou, "Optimal Power Management for a Series Hybrid Electric Vehicle Cognizant of Battery Mechanical Effects," In *American Control Conference*, Portland (2014).

[16] M. T. Lawder, P. W. C. Northrop, and V. R. Subramanian, "Model-Based SEI Layer Growth and Capacity Fade Analysis for EV and PHEV Batteries and Drive Cycles," *J. Electrochem. Soc.*, 161(14), A2099 (2014).

[17] X. Lin, H. Perez, J. Siegel, A. Stefanopoulou, Y. Li, R. Anderson, Y. Ding, and M. Castanier, "Online Parameterization of Lumped Thermal Dynamics in Cylindrical Lithium Ion Batteries for Core Temperature Estimation and Health Monitoring," *Control Systems Technology, IEEE Transactions on*, 21(5), 1745 (September 2013).

[18] X. Lin, A. Stefanopoulou, H. Perez, J. Siegel, Y. Li, and R. Anderson, "Quadruple adaptive observer of the core temperature in cylindrical Li-ion batteries and their health monitoring," In American Control Conference, Montreal (2012).

[19] S. Mohan, Y. Kim, J. B. Siegel, N. A. Samad, and A. G. Stefanopoulou, "A phenomenological model of bulk force in a Li-ion battery pack and its application to state of charge estimation," *J. Electrochem. Soc.*, 161(14), A2222 (2014).

[20] S. Mohan, Y. Kim, and A. G. Stefanopoulou, "On improving battery state of charge estimation using bulk force measurements," *ASME International*, (October 2015).

[21] K.-Y. Oh and B. I. Epureanu, "A novel thermal swelling model for a rechargeable lithium-ion battery cell," *J. Power Sources*, 303, 86 (2016).

[22] K.-Y. Oh, B. I. Epureanu, J. B. Siegel, and A. G. Stefanopoulou, "Phenomenological force and swelling models for rechargeable lithium-ion battery cells," *J. Power Sources*, 310, 118 (2016).

[23] K.-Y. Oh, J. B. Siegel, L. Secondo, S. U. Kim, N. A. Samad, J. Qin, D. Anderson, K. Garikipati, A. Knobloch, B. I. Epureanu, C. W. Monroe, and A. Stefanopoulou, "Rate dependence of swelling in lithium-ion cells," *J. Power Sources*, 267, 197 (2014).

[24] C. Peabody and C. B. Arnold, "The role of mechanically induced separator creep in lithium-ion battery capacity fade," *J. Power Sources*, 196(19), 8147 (2011).

[25] J. Remmlinger, M. Buchholz, M. Meiler, P. Bernreuter, and K. Dietmayer, "State of-health monitoring of lithium-ion batteries in electric vehicles by on-board internal resistance estimation," *J. Power Sources*, 196(12), 5357 (2011).

[26] S. Renganathan, G. Sikha, S. Santhanagopalan, and R. E. White, "Theoretical analysis of stresses in a lithium ion cell," *J. Electrochem. Soc.*, 157(2), A155 (2010).

[27] N. Samad, J. Siegel, A. Stefanopoulou, and A. Knobloch, "Observability Analysis for Surface Sensor Location in Encased Battery Cells," In *American Control Conference*, Chicago (2015).

[28] N. A. Samad, Y. Kim, J. B. Siegel, and A. G. Stefanopoulou, "Influence of Battery Downsizing and SOC Operating Window on Battery Pack Performance in a Hybrid Electric Vehicle," In *Vehicle Power and Propulsion Conference*, Montreal (2015).

[29] G. Sarre, P. Blanchard, and M. Broussely, "Aging of lithium-ion batteries," *J. Power Sources*, 127(12), 65 (2004).

[30] A. Savitzky and M. J. E. Golay, "Smoothing and Differentiation of Data by Simplified Least Squares Procedures," *Anal. Chem.*, 36(8), 1627 (1964).

[31] Z. J. Schiffer, J. Cannarella, and C. B. Arnold, "Strain Derivatives for Practical Charge Rate Characterization of Lithium Ion Electrodes," *J. Electrochem. Soc.*, 163(3), A427 (2016).

[32] U. Troltzsch, O. Kanoun, and H.-R. Trankler, "Characterizing aging effects of lithium ion batteries by impedance spectroscopy," *Electrochim. Acta.*, 51(89), 1664 (2006).

[33] J. Vetter, P. Novak, M. Wagner, C. Veit, K.-C. Moller, J. Besenhard, M. Winter, M. Wohlfahrt-Mehrens, C. Vogler, and A. Hammouche, "Ageing mechanisms in lithium-ion batteries," *J. Power Sources*, 147(12), 269 (2005).

[34] J. Wang, J. Purewal, P. Liu, J. Hicks-Garner, S. Soukazian, E. Sherman, A. Sorenson, L. Vu, H. Tataria, and M. W. Verbrugge, "Degradation of lithium ion batteries employing graphite negatives and nickel-cobalt-manganese oxide+spinel manganese oxide positives: Part 1, aging mechanisms and life estimation," *J. Power Sources*, 269, 937 (2014).

[35] C. Weng, Y. Cui, J. Sun, and H. Peng, "On-board state of health monitoring of lithium ion batteries using incremental capacity analysis with support vector regression," *J. Power Sources,* 235, 36 (2013).

[36] C. Weng, J. Sun, and H. Peng, "A unified open-circuit-voltage model of lithium ion batteries for state-of-charge estimation and state-of-health monitoring," *J. Power Sources,* 258, 228 (2014).

[37] J. Zhang, B. Lu, Y. Song, and X. Ji, "Diffusion induced stress in layered Li-ion battery electrode plates," *J. Power Sources,* 209, 220 (2012).

[38] X. Zhang, W. Shyy, and A. M. Sastry, "Numerical simulation of intercalation-induced stress in li-ion battery electrode particles," *J. Electrochem. Soc.,* 154(10), A910 (2007).

The citation of any document is not to be construed as an admission that it is prior art with respect to the present invention.

Thus, the invention provides a system and method for utilizing force measurements in an incremental capacity analysis method in order to determine the capacity fading and the state of health with less noise and at higher state of charge ranges.

Although the invention has been described in considerable detail with reference to certain embodiments, one skilled in the art will appreciate that the present invention can be practiced by other than the described embodiments, which have been presented for purposes of illustration and not of limitation. Therefore, the scope of the appended claims should not be limited to the description of the embodiments contained herein.

What is claimed is:

1. An electrical device comprising:
a battery;
a sensor for measuring swelling of the battery; and
a battery management system including a controller in electrical communication with the sensor, the controller being configured to execute a program stored in the controller to determine a state of health percentage of the battery based on a reading from the sensor,
wherein the controller is configured to execute a program stored in the controller to determine a state of health percentage of the battery based on correlating features in a force incremental capacity curve and its derivatives and a pressure reading from the sensor, and
wherein the force incremental capacity curve is calculated by:
  (i) measuring a force indicative of swelling within a reference battery over a time period of charge or discharge, wherein the battery is a same type as the reference battery, and
  (ii) taking the derivative of a charge or discharge capacity with respect to force (dQ/dF).

2. The device of claim 1 wherein the sensor is selected from
  (i) a sensor that measures stress, pressure, or force,
  (ii) a sensor that measures strain, or displacement, or
  (iii) a sensor that measures any form of physical deformation.

3. The device of claim 2 wherein:
physical deformation is measured using a hydraulic or mechanical or piezoelectric or optical device.

4. The device of claim 2 wherein:
the battery is packaged with the sensor.

5. The device of claim 1 wherein the sensor is a sensor that measures stress, pressure, or force.

6. The device of claim 1 wherein the sensor is a sensor that measures strain, or displacement.

7. The device of claim 1 wherein the sensor is a sensor that measures any form of physical deformation.

8. The device of claim 1 wherein the battery includes:
  (i) a plurality of cells, or
  (ii) a single cell.

9. The device of claim 8 wherein the cell or cells are selected from:
  (i) prismatic cells, or
  (ii) cylindrical cells, or
  (iii) pouch cells.

10. The device of claim 9 wherein:
each cell comprises:
  a positive electrode selected from lithium nickel manganese cobalt oxide, lithium manganese oxide, and lithium iron phosphate; and
  a negative electrode selected from graphite, lithium titanate, hard carbon, tin/cobalt alloy, and silicon carbon; and
  an electrolyte selected from $LiPF_6$, $LiBF_4$, and $LiClO_4$.

11. The device of claim 1 wherein:
wherein the battery includes a plurality of cells, and
an inner side of a first plate is in contact with a first end of the plurality of cells, and an inner side of a second plate is in contact with a second end of the plurality of cells.

12. The device of claim 11 wherein:
the sensor is a load cell.

13. The device of claim 12 wherein:
the load cell is adjacent an outer side of the first plate.

14. The device of claim 1 wherein:
the battery is a lithium ion battery pack.

15. The device of claim 1 wherein:
the pressure sensor includes a plurality of pressure sensors.

16. The device of claim 1 wherein:
the controller is configured to execute the program stored in the controller to output a signal associated with the state of health or other diagnostic signals to be used in the battery management system.

17. The device of claim 16 wherein the state of health or other diagnostic signals are selected from one or more of:
  (i) capacity fade, or
  (ii) resistance growth, or
  (iii) expected lifetime signal, or
  (iv) anticipated replacement date, or
  (v) pre-failure warning.

18. The device of claim 16 wherein the state of health or other diagnostic signal is capacity fade.

19. The device of claim 16 wherein the state of health or other diagnostic signal is resistance growth.

20. The device of claim 16 wherein the state of health or other diagnostic signal is expected lifetime signal.

21. The device of claim 16 wherein the state of health or other diagnostic signal is anticipated replacement date.

22. The device of claim 16 wherein the state of health or other diagnostic signal is pre-failure warning.

23. The device of claim 1 wherein:
the reading from the sensor is taken during charge or discharge of the battery.

24. The device of claim 1 wherein:
the controller determines the state of health percentage of the battery every time the battery is charged or discharged.

25. The device of claim 1 wherein:
the controller determines the state of health percentage of the battery every time the battery discharges below a 70% state of charge.

26. A vehicle comprising:
   the electrical device of claim 1 configured to supply electrical power to propel the vehicle, or to supplement propulsion or electric load in a vehicle.

27. A consumer electronics apparatus comprising:
   the electrical device of claim 1.

28. The device of claim 1 wherein the force incremental capacity curve is further derived by:
   (iii) correlating the derivative of the charge or discharge capacity with respect to force (dQ/dF) versus voltage.

29. A battery management system for a battery including a sensor for measuring a swelling of the battery, the battery management system comprising:
   a controller in electrical communication with the sensor, the controller being configured to execute a program stored in the controller to determine a state of health percentage of the battery based on a reading from the sensor,
   wherein the controller is configured to execute a program stored in the controller to determine a state of health percentage of the battery based on correlating features in a force incremental capacity curve and its derivatives and a pressure reading from the sensor, and
   wherein the force incremental capacity curve is calculated by:
   (i) measuring a force indicative of swelling within a reference battery over a time period of charge or discharge, wherein the battery is a same type as the reference battery, and
   (ii) taking the derivative of a charge or discharge capacity with respect to force (dQ/dF).

30. The battery management system of claim 29 wherein the force incremental capacity curve is further derived by:
   (iii) correlating the derivative of the charge or discharge capacity with respect to force (dQ/dF) versus voltage.

31. The battery management system of claim 29 wherein the force incremental capacity curve is further derived by:
   (iii) quantifying peaks or location of peaks of the force incremental capacity curve.

32. The battery management system of claim 29 wherein taking the derivative of the charge or discharge capacity with respect to force includes first processing data of measured force over the time period of charge or discharge by applying a post processing technique.

33. The battery management system of claim 32 wherein applying a post processing technique includes:
   (i) applying a filter, or
   (ii) smoothening and averaging, or
   (iii) using statistical methods.

34. The battery management system of claim 29 wherein:
   the controller is configured to execute the program stored in the controller to output a signal associated with the state of health or other diagnostic signals to be used in the battery management system.

35. The battery management system of claim 34 wherein the state of health or other diagnostic signals are selected from one or more of:
   (i) capacity fade, or
   (ii) resistance growth, or
   (iii) expected lifetime signal, or
   (iv) anticipated replacement date, or
   (v) pre-failure warning.

36. The battery management system of claim 34 wherein the state of health or other diagnostic signal is capacity fade.

37. The battery management system of claim 34 wherein the state of health or other diagnostic signal is resistance growth.

38. The battery management system of claim 34 wherein the state of health or other diagnostic signal is expected lifetime signal.

39. The battery management system of claim 34 wherein the state of health or other diagnostic signal is anticipated replacement date.

40. The battery management system of claim 34 wherein the state of health or other diagnostic signal is pre-failure warning.

41. The battery management system of claim 29 wherein:
   the reading from the sensor is taken during charge or discharge of the battery.

42. The battery management system of claim 29 wherein:
   the controller determines the state of health percentage of the battery every time the battery is charged or discharged.

43. The battery management system of claim 29 wherein:
   the controller determines the state of health percentage of the battery every time the battery discharges below a 70% state of charge.

\* \* \* \* \*

UNITED STATES PATENT AND TRADEMARK OFFICE
CERTIFICATE OF CORRECTION

| | |
|---|---|
| PATENT NO. | : 11,623,526 B2 |
| APPLICATION NO. | : 15/777384 |
| DATED | : April 11, 2023 |
| INVENTOR(S) | : Anna G. Stefanopoulou et al. |

It is certified that error appears in the above-identified patent and that said Letters Patent is hereby corrected as shown below:

In the Specification

Column 11, Line 35, "is 2.5%" should be --is $\leq$ 2.5%--.

Signed and Sealed this
Twenty-second Day of August, 2023

Katherine Kelly Vidal
*Director of the United States Patent and Trademark Office*